US011687252B2

(12) United States Patent
Li et al.

(10) Patent No.: US 11,687,252 B2
(45) Date of Patent: Jun. 27, 2023

(54) NON-VOLATILE MEMORY WITH PRE-TRAINED MODEL AND INFERENCE CIRCUIT

(71) Applicant: WESTERN DIGITAL TECHNOLOGIES, INC., San Jose, CA (US)

(72) Inventors: Liang Li, Shanghai (CN); Yinfeng Yu, Shanghai (CN); Loc Tu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 129 days.

(21) Appl. No.: 17/503,612

(22) Filed: Oct. 18, 2021

(65) Prior Publication Data

US 2023/0124035 A1  Apr. 20, 2023

(51) Int. Cl.
*G06F 12/00* (2006.01)
*G06F 3/06* (2006.01)
*H01L 25/065* (2023.01)
*G11C 16/04* (2006.01)
*G11C 16/10* (2006.01)
*G06N 5/04* (2023.01)
*G11C 16/26* (2006.01)
*G11C 11/56* (2006.01)

(52) U.S. Cl.
CPC .......... *G06F 3/0619* (2013.01); *G06F 3/0655* (2013.01); *G06F 3/0679* (2013.01); *G06N 5/04* (2013.01); *G11C 16/0483* (2013.01); *G11C 16/10* (2013.01); *G11C 16/26* (2013.01); *H01L 25/0657* (2013.01); *G11C 11/5671* (2013.01); *H01L 2225/06562* (2013.01)

(58) Field of Classification Search
CPC .... G06F 3/0619; G06F 3/0655; G06F 3/0679; G06N 5/04; G11C 16/0483; G11C 16/10; G11C 16/26; G11C 11/5671; H01L 25/0657; H01L 2225/06562
USPC ....................................................... 711/154
See application file for complete search history.

(56) References Cited

U.S. PATENT DOCUMENTS 10,565,123 B2   2/2020  Song
10,573,397 B1   2/2020  Sehgal
10,649,988 B1   5/2020  Gold
10,691,537 B2   6/2020  Sun
(Continued)

OTHER PUBLICATIONS

PCT International Search Report and Written Opinion dated Sep. 21, 2022, PCT Patent Application No. PCT/US2022/028424.
U.S. Appl. No. 17/359,989, filed Jun. 28, 2021.

*Primary Examiner* — Mardochee Chery
(74) *Attorney, Agent, or Firm* — Vierra Magen Marcus LLP

(57) ABSTRACT

A non-volatile storage apparatus comprises one or more memory die assemblies, each of which includes an inference circuit positioned in the memory die assembly. The inference circuit is configured to use a pre-trained model (received pre-trained from a source external to the non-volatile storage apparatus and stored in a dedicated block in non-volatile memory) with one or more metrics describing current operation of the non-volatile storage apparatus in order to predict a defect in the non-volatile storage apparatus and perform a countermeasure to preserve host data prior to a non-recoverable failure in the non-volatile storage apparatus due to the defect.

18 Claims, 22 Drawing Sheets

(56) References Cited

U.S. PATENT DOCUMENTS

| | | |
|---|---|---|
| 10,922,380 B2 | 2/2021 | Korthikanti |
| 11,088,712 B2 | 8/2021 | Zamir |
| 2018/0174658 A1 | 6/2018 | Kikuchi |
| 2019/0042937 A1 | 2/2019 | Sheller |
| 2019/0108888 A1 | 4/2019 | Sarkar |
| 2019/0205729 A1 | 7/2019 | Tran |
| 2019/0311267 A1 | 10/2019 | Qin |
| 2020/0020393 A1 | 1/2020 | Al-Shamma |
| 2020/0134469 A1 | 4/2020 | Choo et al. |
| 2020/0311512 A1 | 10/2020 | Choi |
| 2020/0342945 A1 | 10/2020 | Sarkar et al. |
| 2020/0356718 A1 | 11/2020 | Chu |
| 2021/0110244 A1 | 4/2021 | Hoang |
| 2021/0173734 A1 | 6/2021 | Lee |
| 2021/0182152 A1 | 6/2021 | Shin et al. |
| 2021/0192325 A1 | 6/2021 | Hoang |
| 2021/0271549 A1 | 9/2021 | Khayat et al. |
| 2021/0342204 A1* | 11/2021 | Choudhury ............ G06F 11/008 |
| 2023/0080002 A1* | 3/2023 | Angilella ............... G07C 5/006 73/117.03 |

\* cited by examiner

Figure 4C
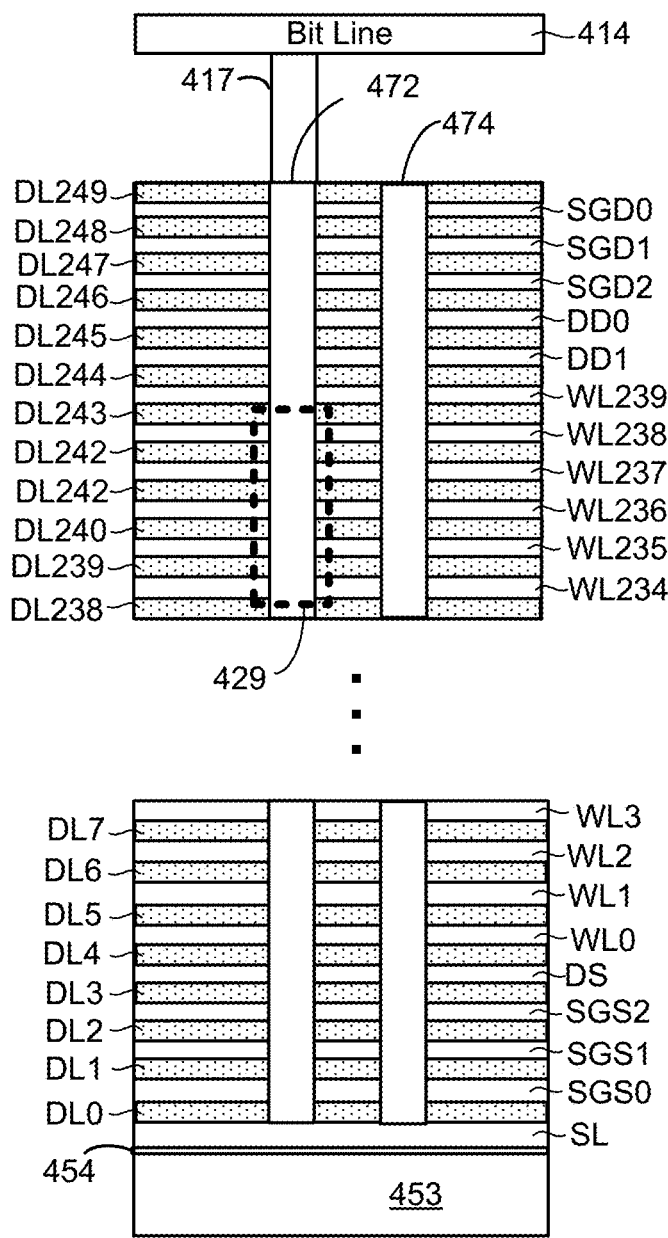
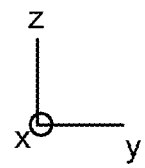

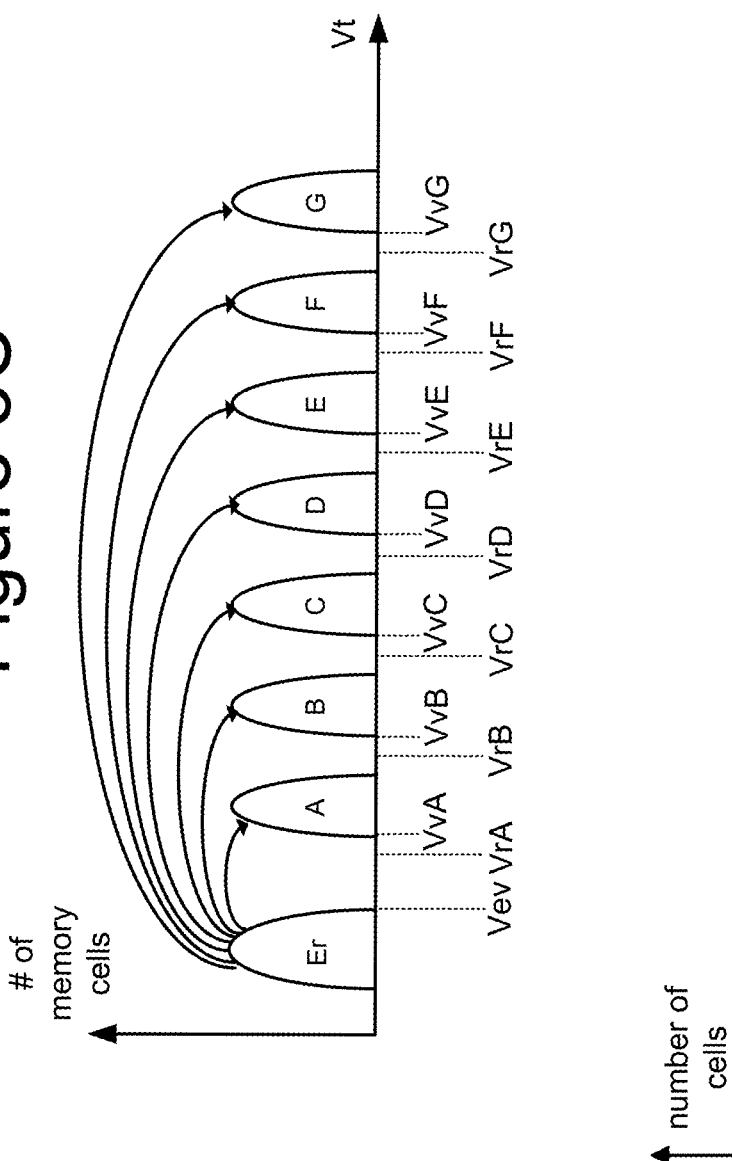
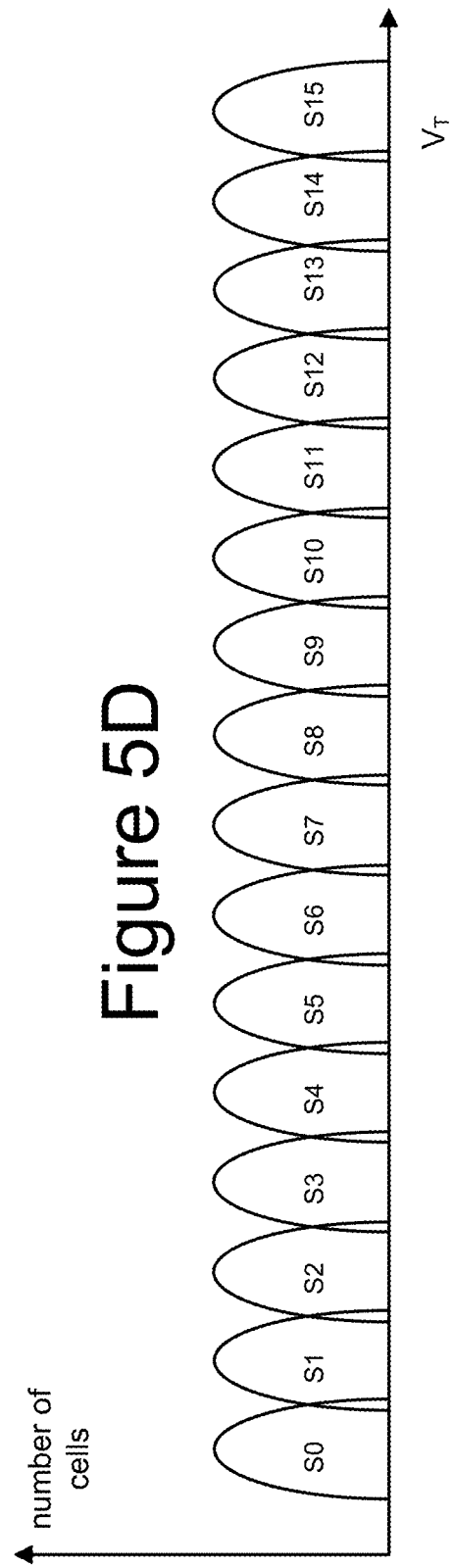

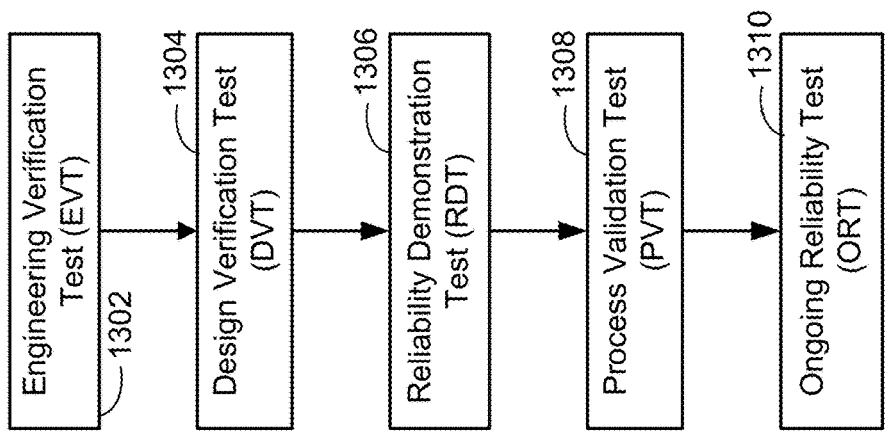
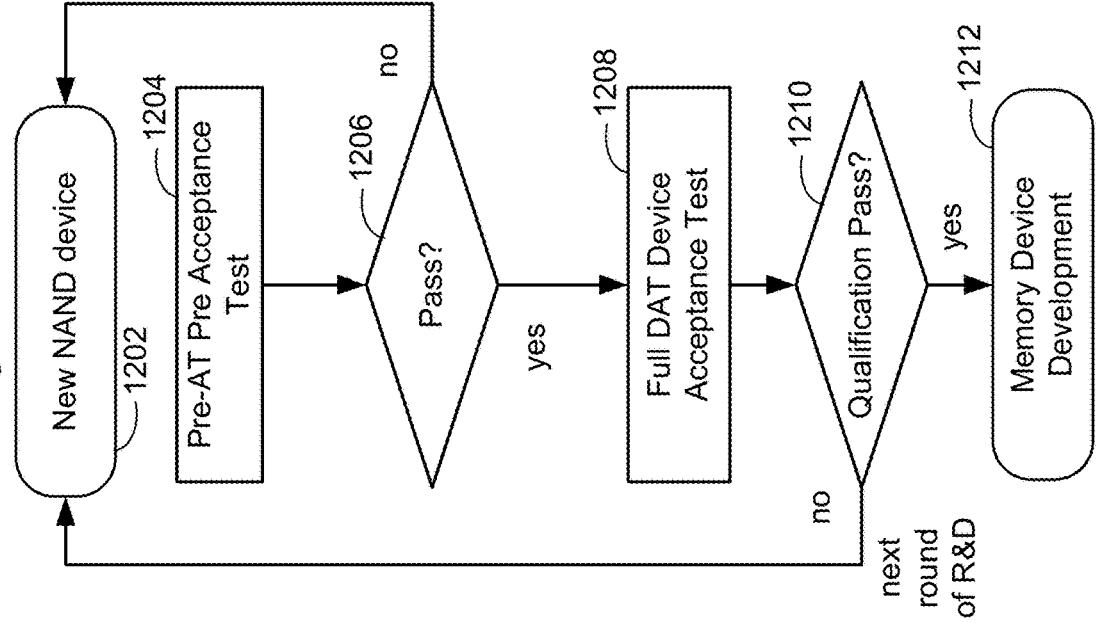
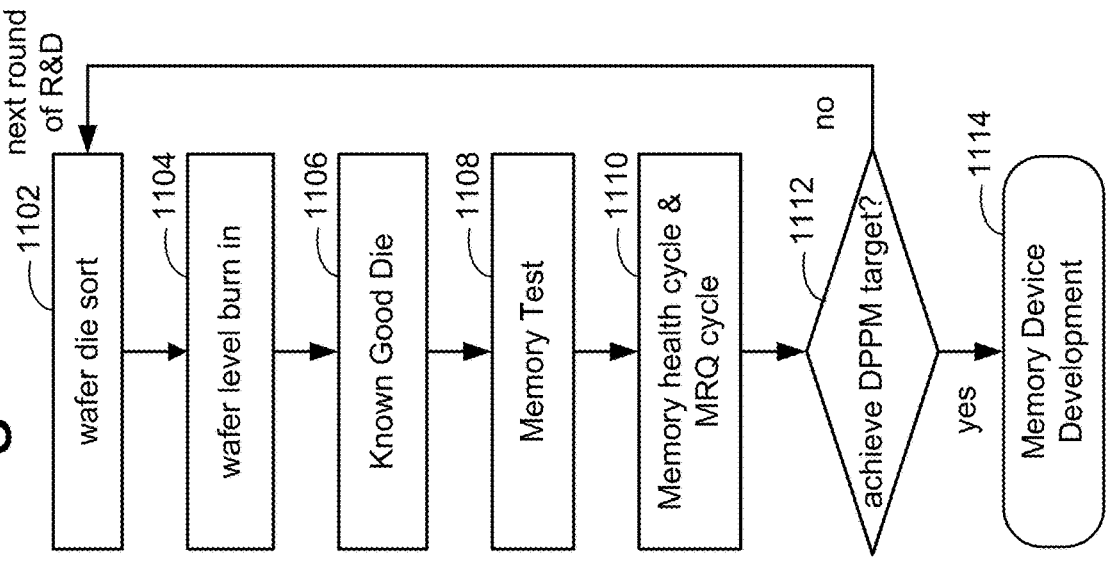

NON-VOLATILE MEMORY WITH PRE-TRAINED MODEL AND INFERENCE CIRCUIT

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 4C depicts a cross sectional view of a portion of one embodiment of a block of memory cells.

FIG. 5C depicts threshold voltage distributions.

FIG. 5D depicts threshold voltage distributions.

FIGS. 11-13 are flow charts describing various embodiment of processes performed during research and development of memory devices that produce data which can be used to train a model.

DETAILED DESCRIPTION

In order to more reliably store data in non-volatile memory storage system, a memory health management system based on machine learning is used to predict a defect in the storage system before there is a failure that can affect the data being stored.

In one embodiment, a non-volatile storage apparatus comprises one or more memory die assemblies, each of which includes an inference circuit positioned in the memory die assembly. The inference circuit is configured to use a pre-trained model (received pre-trained from a source external to the non-volatile storage apparatus and stored in one or more dedicated blocks in non-volatile memory) with one or more metrics describing current operation of the non-volatile storage apparatus in order to predict a defect in the non-volatile storage apparatus and perform a countermeasure to preserve host data prior to a non-recoverable failure in the non-volatile storage apparatus due to the defect.

Figure 1:
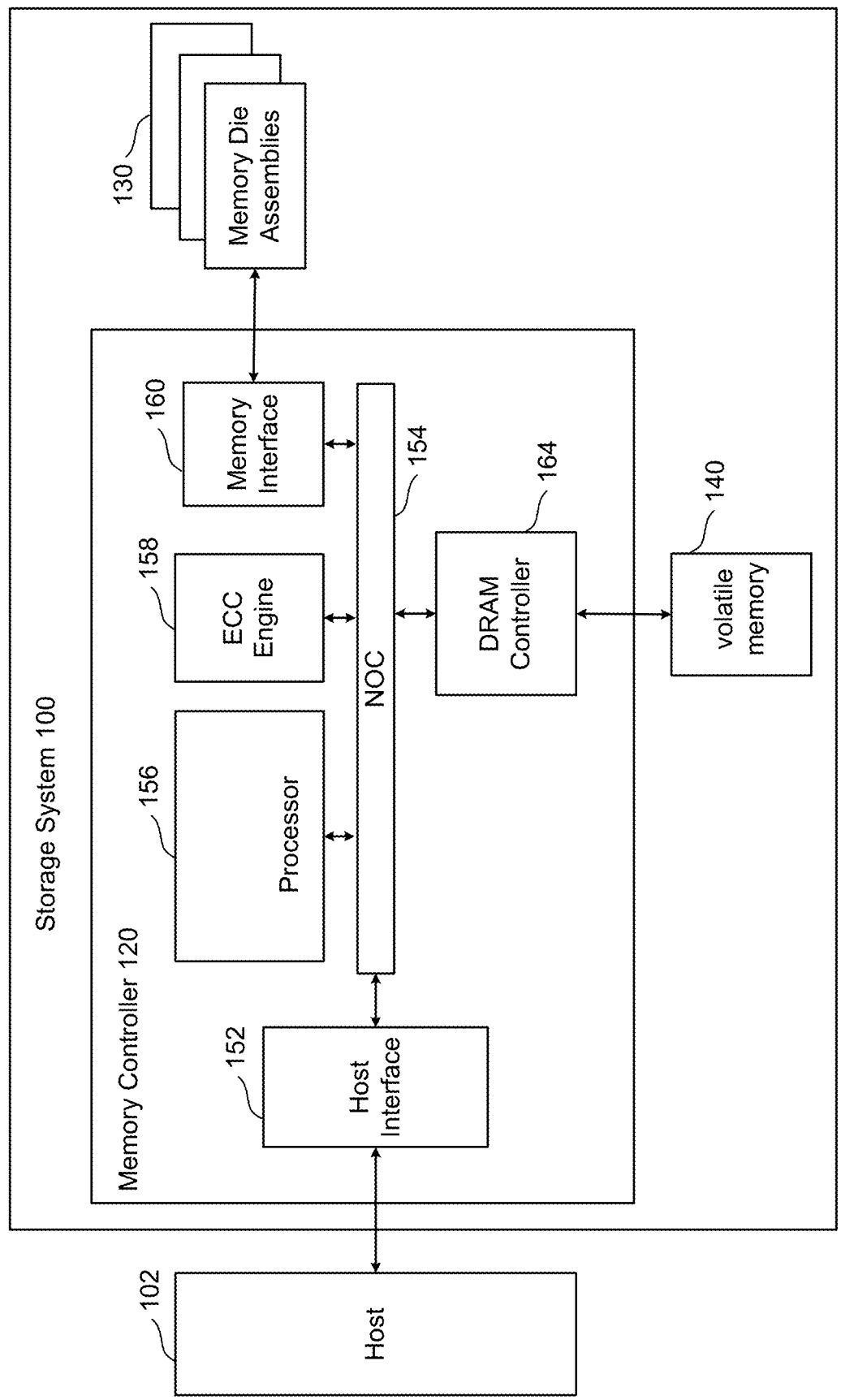
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to one or more memory die assemblies 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in the one or more memory die assemblies 130 and a subset of the L2P tables are cached (L2P cache) in the local high speed volatile memory 140.

Memory interface 160 communicates with the one or more memory die assemblies 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
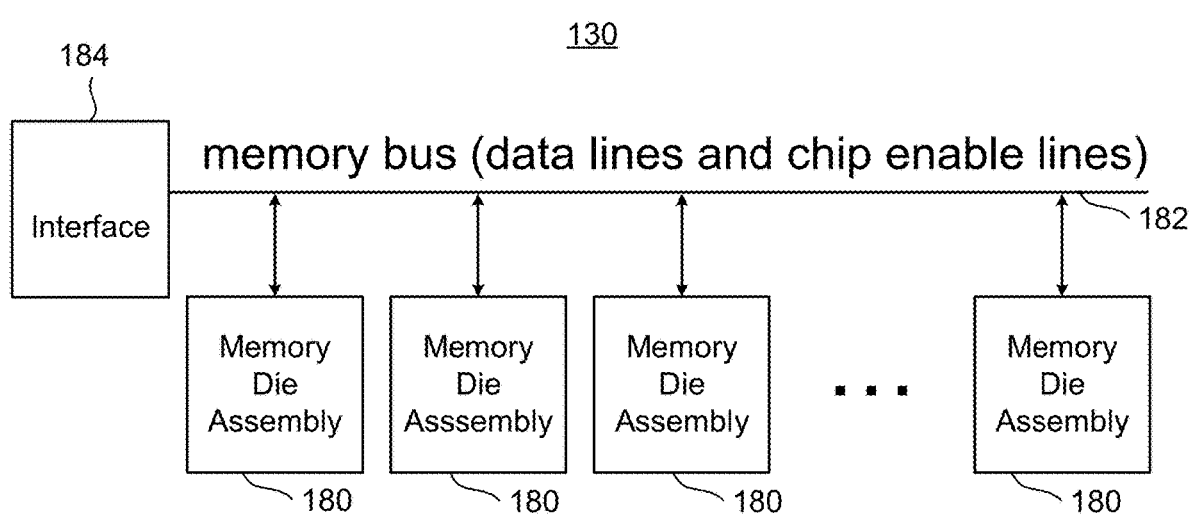
FIG. 2 is a block diagram depicting one embodiment of a plurality of memory die assemblies.

FIG. 2 is a block diagram depicting one embodiment of the one or more memory die assemblies 130 of FIG. 1. FIG. 2 shows the one or more memory die assemblies 130 comprises a plurality of individual memory die assemblies 180 connected to a memory bus (data lines and chip enable lines) 182. The memory bus 182 connects to interface 184 (e.g., a Toggle Mode Interface) for communicating with memory controller 120. The technology described herein is not limited to any particular number of memory die assemblies 180.

Figure 2A:
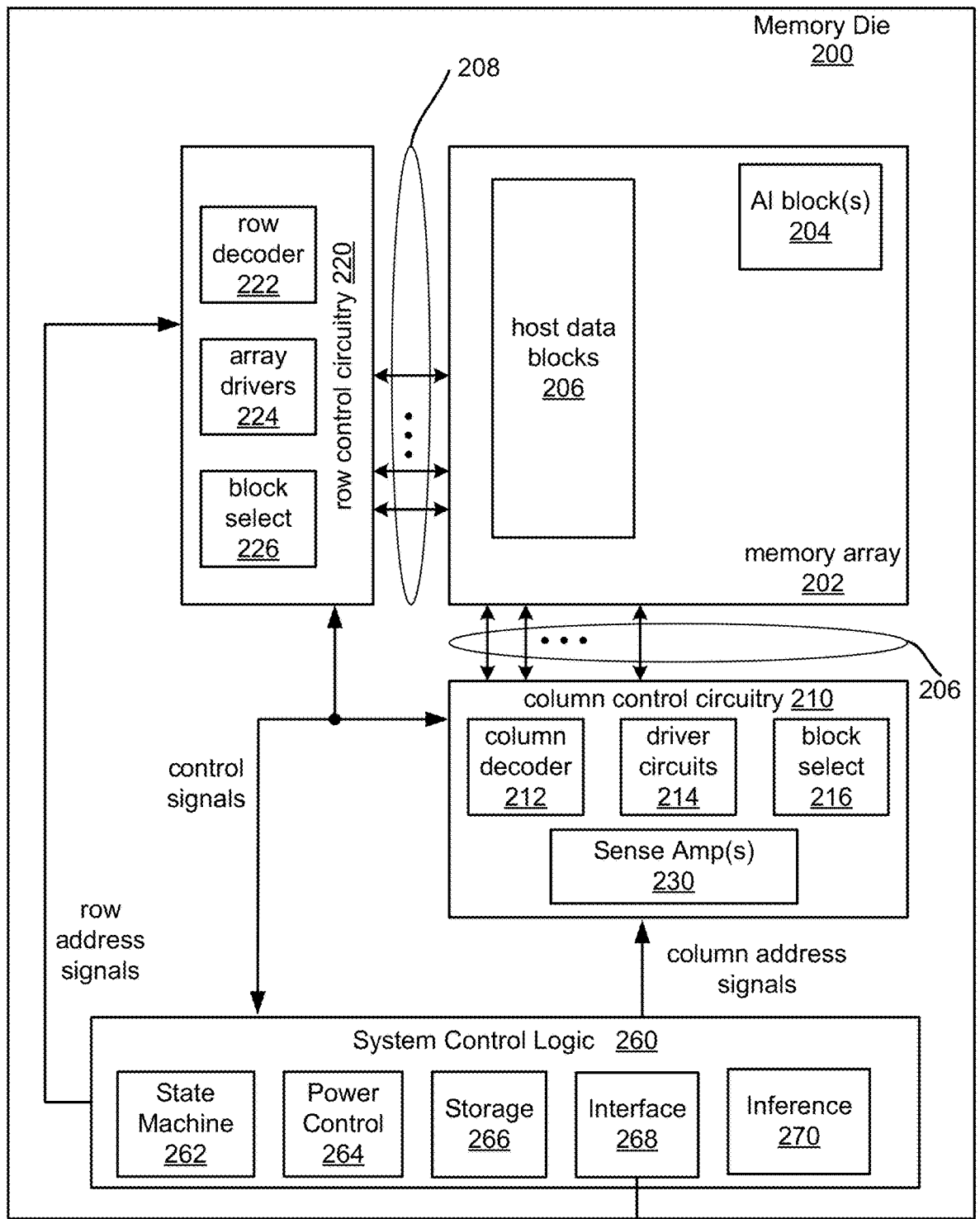
FIG. 2A is a block diagram of one embodiment of a memory die.

FIG. 2A is a functional block diagram of memory die 200, which is one embodiment of a memory die assembly 180. The components depicted in FIG. 2A are electrical circuits. Memory die 200 includes a non-volatile memory array 202 (which is one example of a non-volatile memory structure) that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory array 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 360, can be formed as part of a single die. In other embodiments, some or all of the system control logic 260 can be formed on a different die.

In one embodiment, memory array 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory array 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory array 202 is not limited to the examples above. Many different types of memory array architectures or memory technologies can be used to form memory array 202. No particular non-volatile memory technology is required for purposes of the new claimed embodiments proposed herein. Other examples of suitable technologies for memory cells of the memory array/structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory array 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

In one embodiment, memory array 202 comprises a first set of non-volatile memory cells 206 configured to store host data and a second set of non-volatile memory cells 204 that store a pre-trained model received pre-trained from a source external to the non-volatile storage apparatus. In one embodiment, the second set of non-volatile memory cells 204 that store the pre-trained model comprises one or more blocks of memory cells (e.g., one or more erase blocks dedicated to storing the pre-trained model, where an erase block is the unit of erase), referred to as Artificial Intelligence ("AI") block(s). More details about the pre-trained model are provided below. In one embodiment, the first set of non-volatile memory cells 206 that store host data comprise hundreds, thousand or millions of blocks of memory cells (e.g., one or more erase blocks, where an erase block is the unit of erase).

In one embodiment, the System Control Logic 260 (e.g., which is configured to write to and read from the memory array 202) further includes an inference circuit 270 (e.g., an electrical circuit), which is also referred to as an AI circuit. In the embodiment of FIG. 2A, the inference circuit 270 and the memory array are positioned in the memory die assembly (e.g. on memory die 200). In one embodiment, inference circuit 270, is configured to use the pre-trained model from the second set of non-volatile memory cells 204 (AI blocks) with one or more metrics describing current operation of storage system 100 in order to predict a defect in the storage system 100 and perform a countermeasure to preserve the host data prior to a non-recoverable failure in the storage system 100 due to the defect. More details are provided below.

The elements of FIG. 2A can be grouped into two parts: (1) memory array 202 and (2) peripheral circuitry, where peripheral circuitry includes all of the components depicted in FIG. 2A other than memory array 202. An important characteristic of a memory circuit is its capacity, which can be increased by increasing the area of the memory die of storage system 100 that is given over to the memory array 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory array 202 and the amount of area to devote to the peripheral circuitry.

Another area in which the memory array 202 and the peripheral circuitry are often at odds is in the processing involved in forming these regions, since these regions often involve differing processing technologies and the trade-off in having differing technologies on a single die. For example, when the memory array 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory array 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
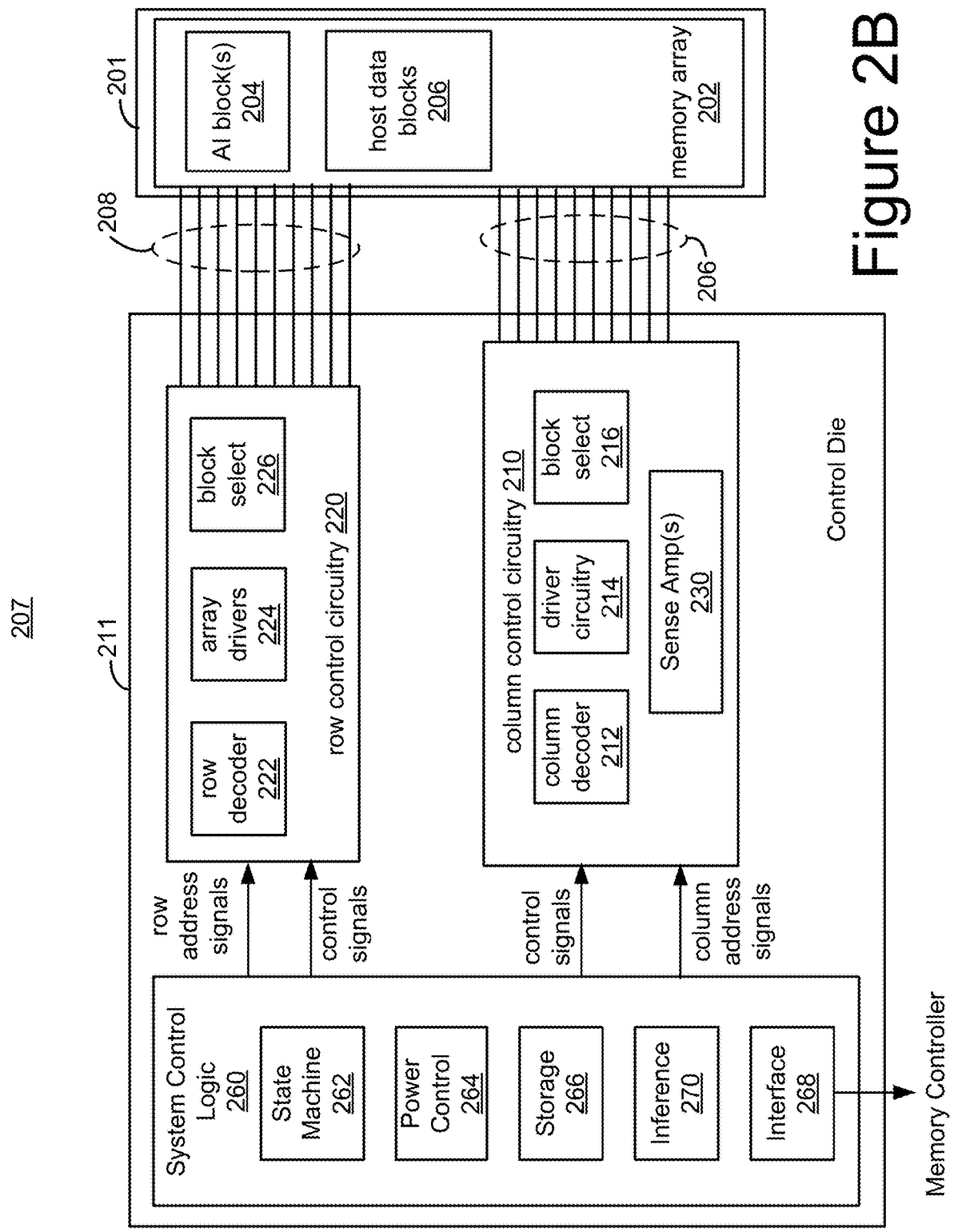
FIG. 2B is a block diagram of one embodiment of an integrated memory assembly.

FIG. 2B shows an alternative arrangement to that of FIG. 2A which may be implemented using wafer-to-wafer bonding to provide a bonded die pair comprising a memory die and a control die. In that regard, FIG. 2B is a functional block diagram of integrated memory assembly 207, which is another embodiment of a memory die assembly 180. The components depicted in FIG. 2B are electrical circuits. The integrated memory assembly 207 includes two types of semiconductor die (or more succinctly, "die"). Memory die 201 includes memory array 202. Memory array 202 includes non-volatile memory cells. Control die 211 includes control circuitry 260, 210, and 220 (as described above). In some embodiments, control die 211 is configured to connect to the memory array 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory array 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory array 202 on the memory die 201 through electrical paths 206. For example, electrical paths 206 may provide electrical connection between column decoder 212, driver circuitry 214, and block select 216 and bit lines of memory array 202. Electrical paths may extend from column control circuitry 210 in control die 211 through pads on control die 211 that are bonded to corresponding pads of the memory die 201, which are connected to bit lines of memory array 202. Each bit line of memory array 202 may have a corresponding electrical path in electrical paths 306, including a pair of bond pads, which connects to column control circuitry 210. Similarly, row control circuitry 220, including row decoder 222, array drivers 224, and block select 226 are coupled to memory array 202 through electrical paths 208. Each of electrical path 208 may correspond to a word line, dummy word line, or select gate line. Additional electrical paths may also be provided between control die 211 and memory die 201.

As in FIG. 2A, the system control logic 260 of FIG. 2B includes inference circuit 270 which is configured to use the pre-trained model from the second set of non-volatile memory cells 204 with one or more metrics describing current operation of storage system 100 in order to predict a defect in the storage system 100 and perform a countermeasure to preserve the host data prior to a non-recoverable failure in the storage system 100 due to the defect. Thus, FIG. 2B depicts an embodiment in which the memory die assembly comprises a memory die bonded to control die, the non-volatile memory is positioned on the memory die, and the inference circuit is positioned on the control die.

For purposes of this document, the phrases "a control circuit" or "one or more control circuits" can include any one of or any combination of memory controller 120, state machine 262, all or a portion of system control logic 260 (e.g., including inference circuit 270), all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit. In another example, the control circuit can include memory controller 120 in combination with all of the components of FIG. 2A or 2B, excluding memory array 202.

Figure 2C:
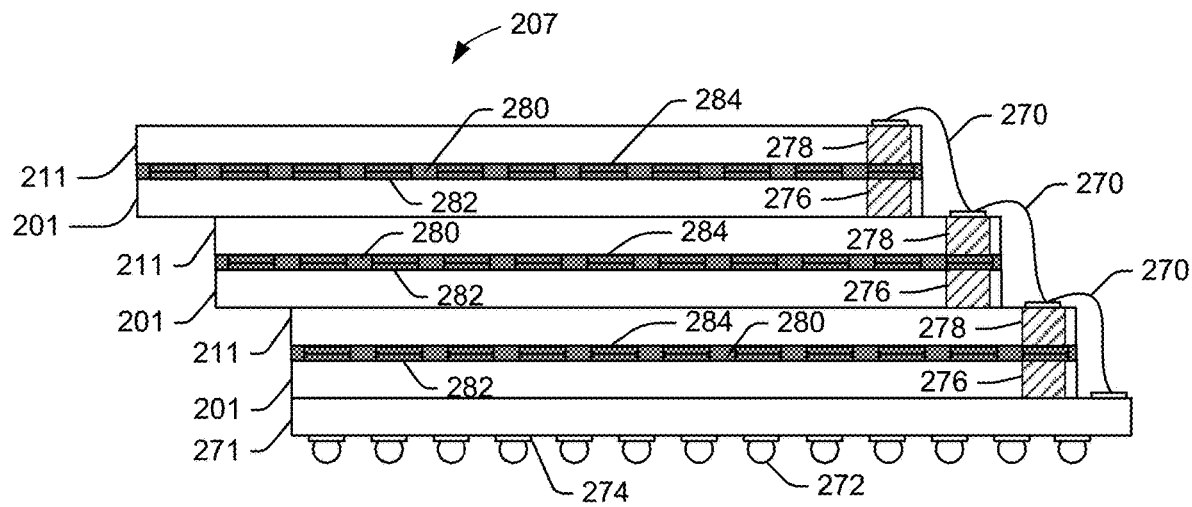
FIGS. 2C and 2D depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
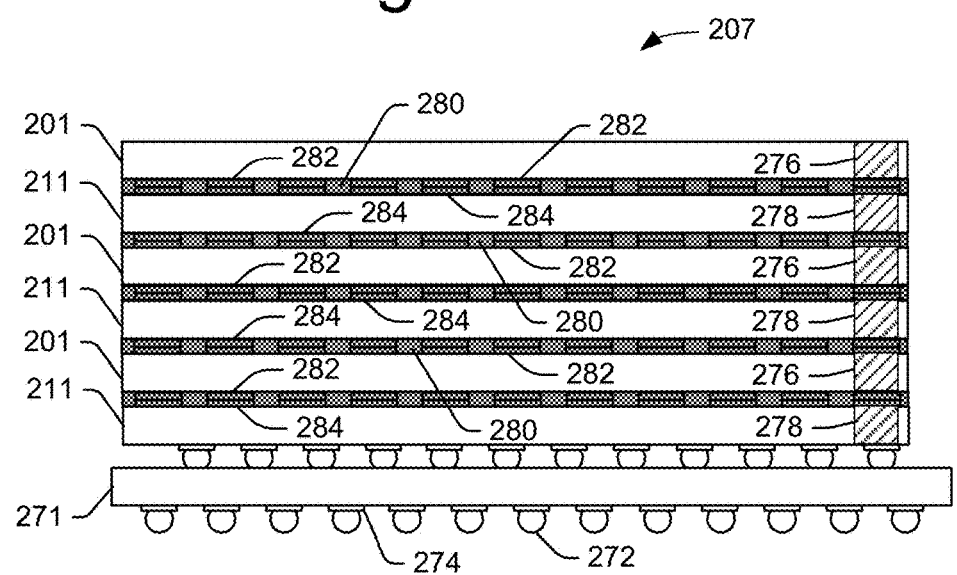

FIG. 2D depicts a side view of another embodiment of an integrated memory assembly 207 stacked on a substrate 271. The integrated memory assembly 206 of FIG. 2D has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
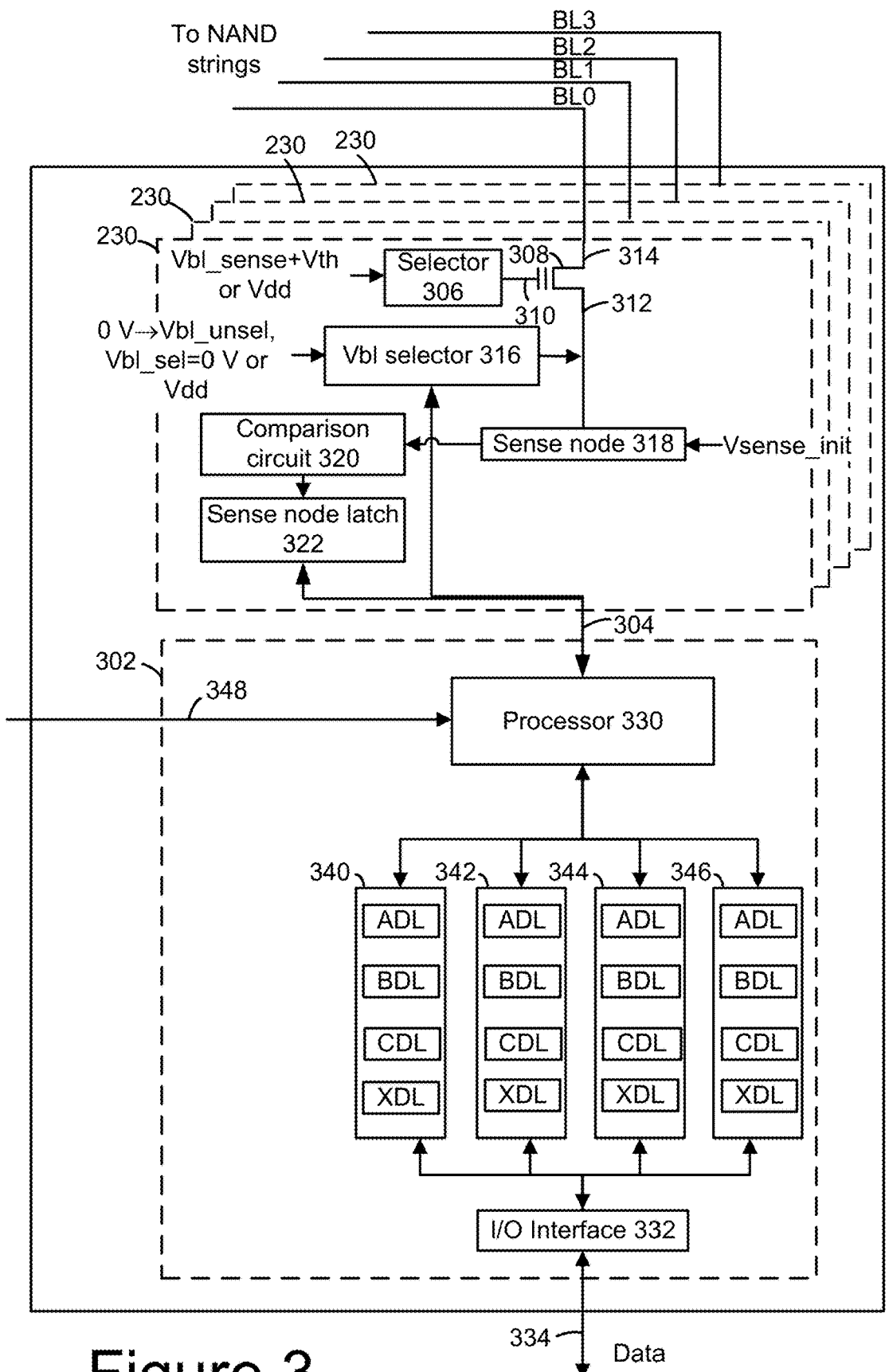
FIG. 3 depicts circuitry used to sense data from non-volatile memory.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line which in turn is connected to one or more NAND strings. In one example implementation, each bit line is connected to six NAND strings, with one NAND string per sub-block. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to bit lines (see BL0, BL1, BL2, BL3) during program, verify, erase and read operations. Sense amplifiers are also used to sense the condition (e.g., data state) to a memory cells in a NAND string connected to the bit line that connects to the respective sense amplifier.

Each sense amplifier 230 includes a selector 306 or switch connected to a transistor 308 (e.g., an nMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg–Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg–Vcelsrc–Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3 V. The sense node is then passed to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or program level in a next program loop. L Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or less than four can be implemented. In one embodiment, there is one set of latches for each sense amplifier 230. One set of three data latches, e.g., comprising individual latches ADL, BDL, CDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell.

As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two are in agreement, processor 330 sets the bit line in a program inhibit mode such as by updating its latches. This inhibits the memory cell coupled to the bit line from further programming even if additional program pulses are applied to its control gate.

Figure 4:
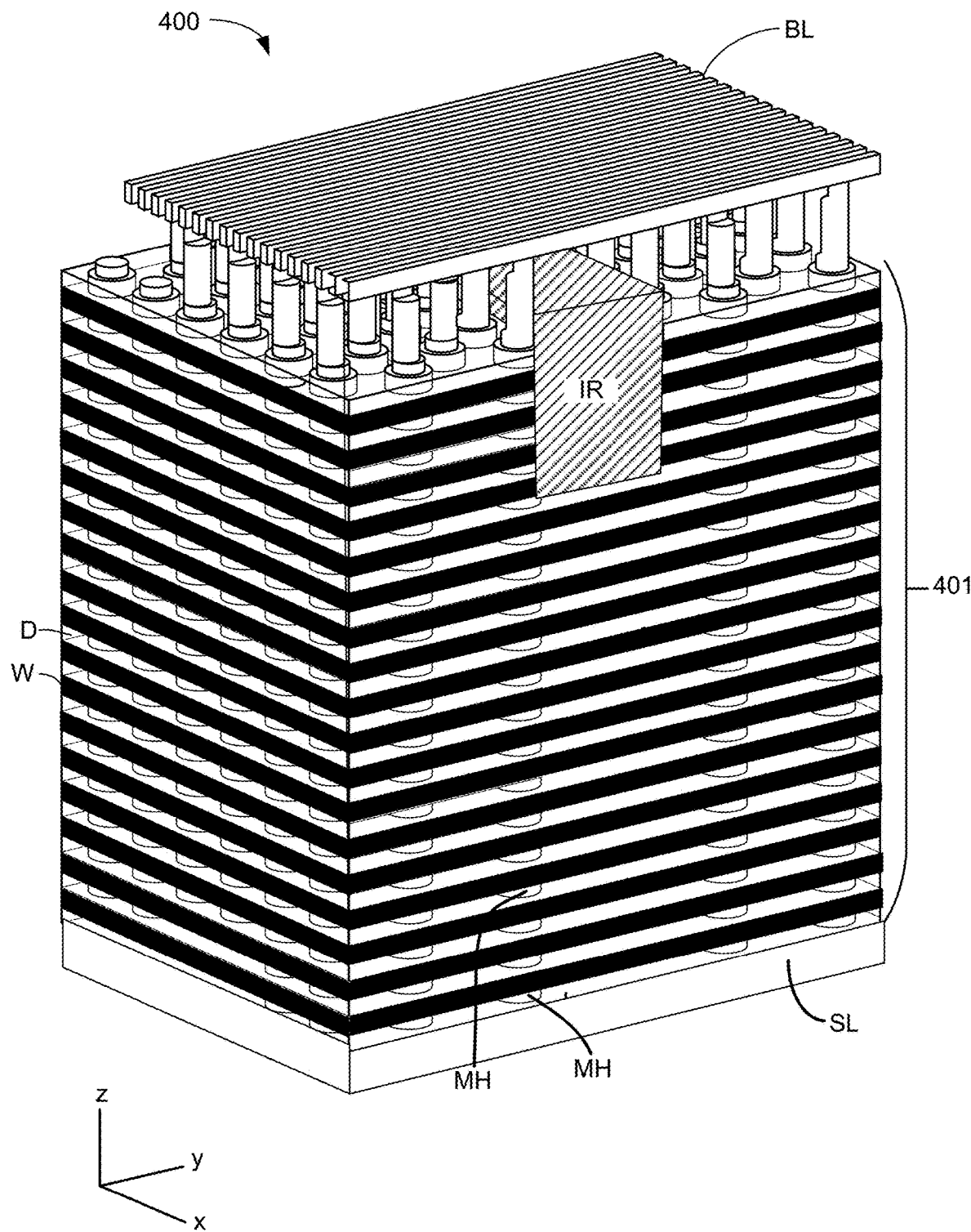
FIG. 4 is a perspective view of a portion of one embodiment of a monolithic three dimensional memory structure.

FIG. 4 is a perspective view of a portion of one example embodiment of a monolithic three dimensional memory array/structure that can comprise memory array 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory array 202 is provided below.

Figure 4A:
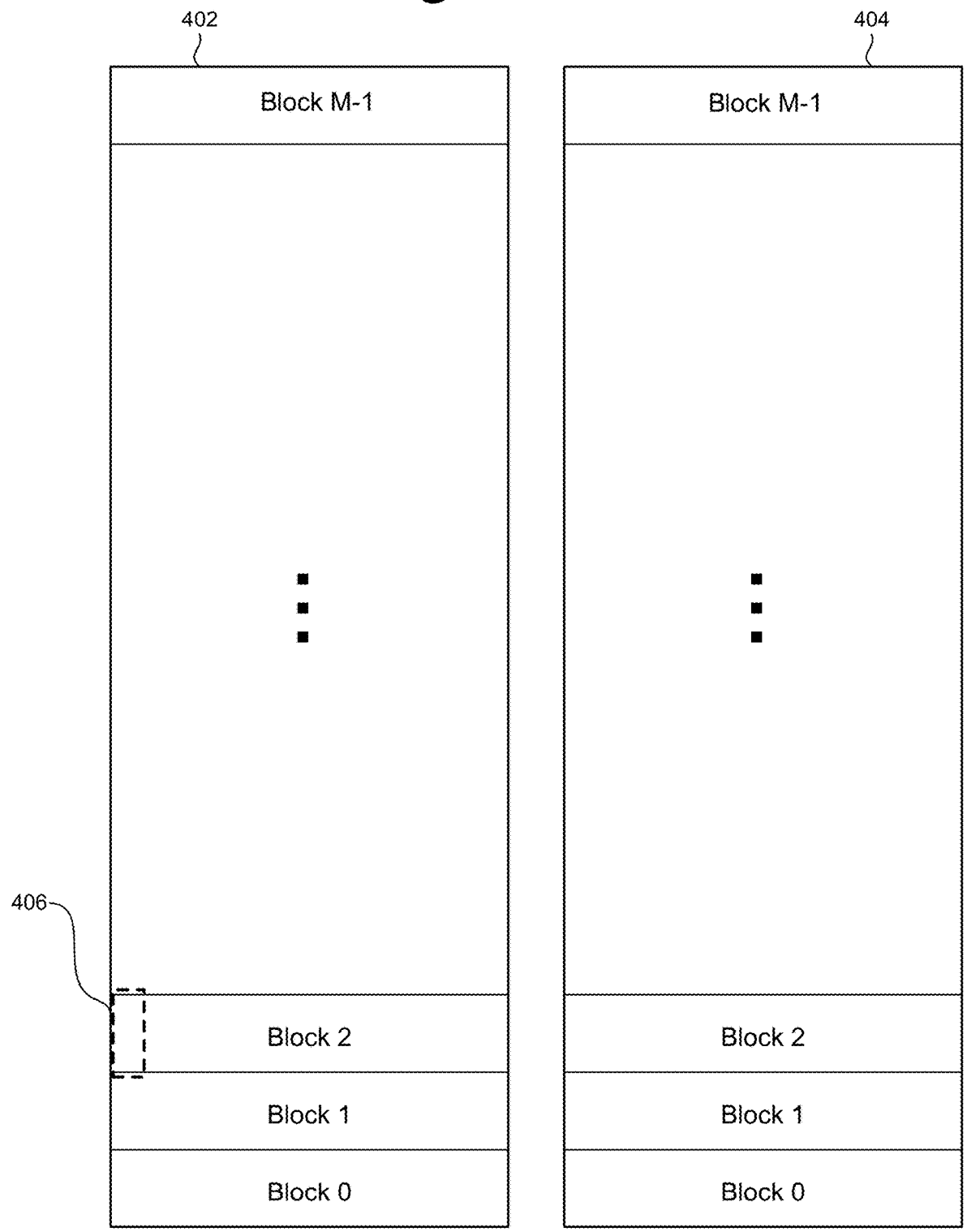
FIG. 4A is a block diagram of one embodiment of a memory structure having two planes.

FIG. 4A is a block diagram explaining one example organization of memory array 202, which is divided into two planes 402 and 404. Each plane is then divided into M blocks. In one example, each plane has about 2000 blocks. However, different numbers of blocks and planes can also be used. In on embodiment, a block of memory cells is a unit of erase (e.g., also called an erase block). That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory array 202 includes eight planes. In other embodiments, a memory array can include more than eight planes.

Figure 4B:
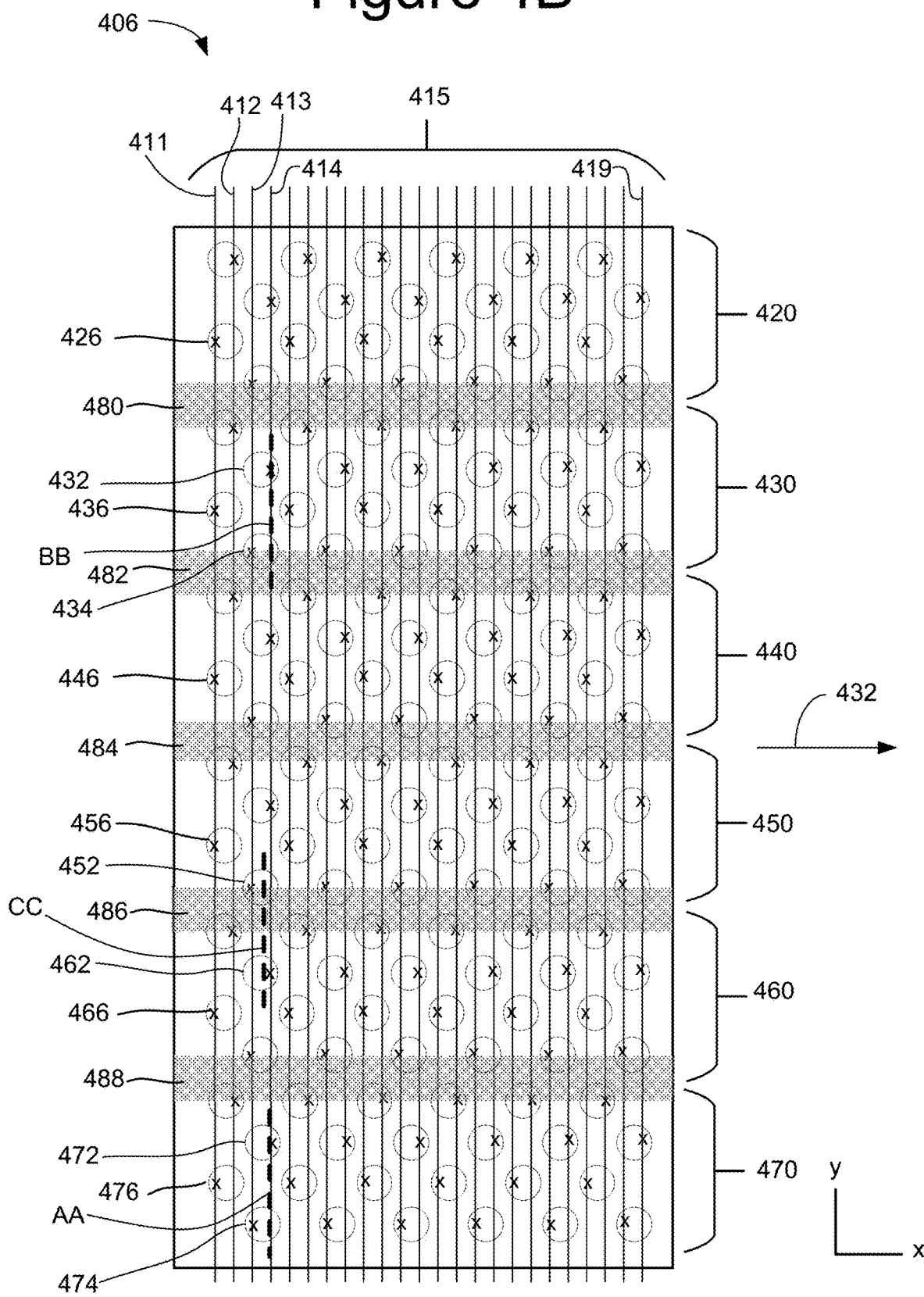
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory array 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

FIG. 4C depicts a portion of one embodiment of a three dimensional memory array 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers D10-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data, while a data memory cell is eligible to store host data. For purposes of this document, host data is data provided from the host or entity outside of the storage system 100, such as data from a user of the host 102. Host data can be contrasted with system data that is generated by memory system 100 (e.g., L2P tables). In some embodiments, data memory cells and dummy memory cells may have a same structure. Drain select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
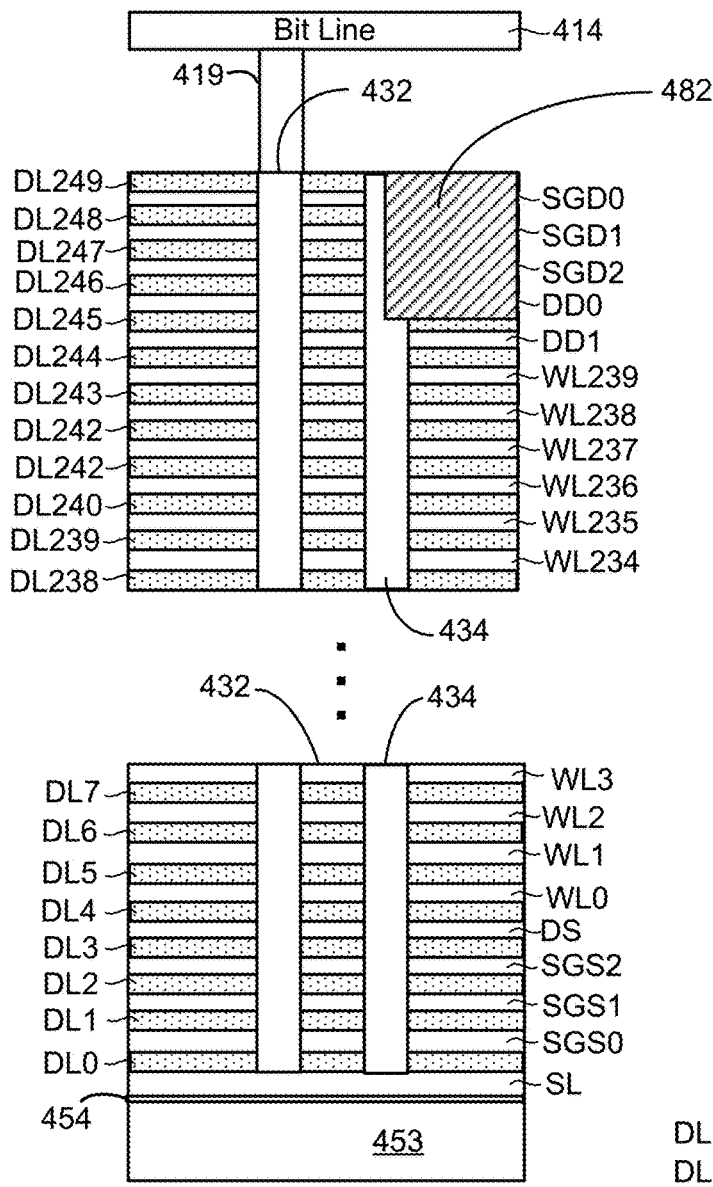
FIG. 4D depicts a cross sectional view of a portion of one embodiment of a block of memory cells.

FIG. 4D depicts a portion of one embodiment of a three dimensional memory array 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
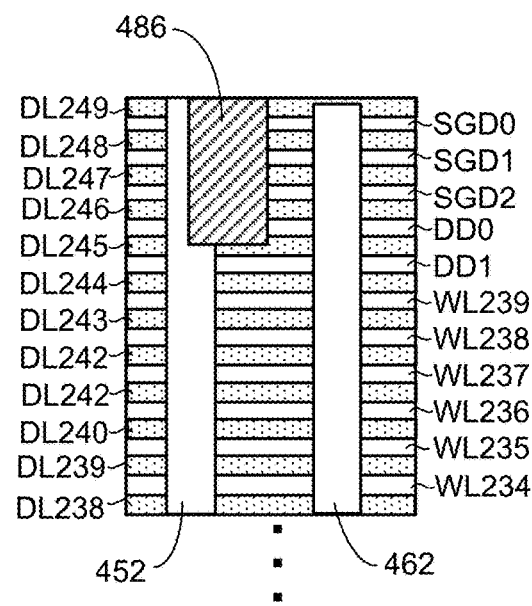
FIG. 4E depicts a cross sectional view of a portion of one embodiment of a block of memory cells.

FIG. 4E depicts a portion of one embodiment of a three dimensional memory array 202 showing a cross-sectional view along line CC of FIG. 4B. This cross sectional view cuts through vertical columns (NAND strings) 452 and 4624 (see FIG. 4B). FIG. 4E shows the same alternating conductive and dielectric layers as FIG. 4C. FIG. 4E also shows isolation region 486 cutting into vertical columns (NAND string) 452.

Figure 4F:
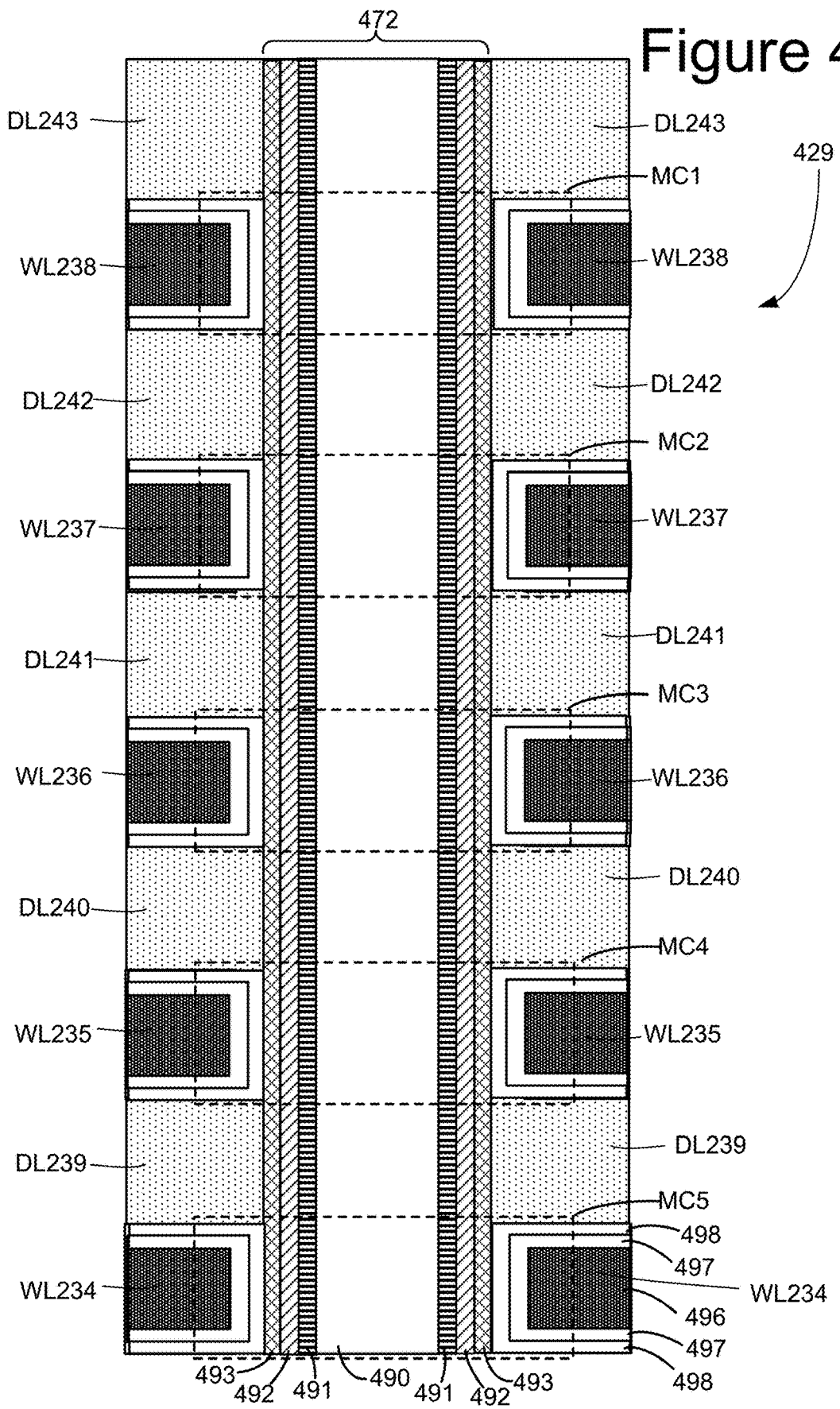
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as SiO$_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4D depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
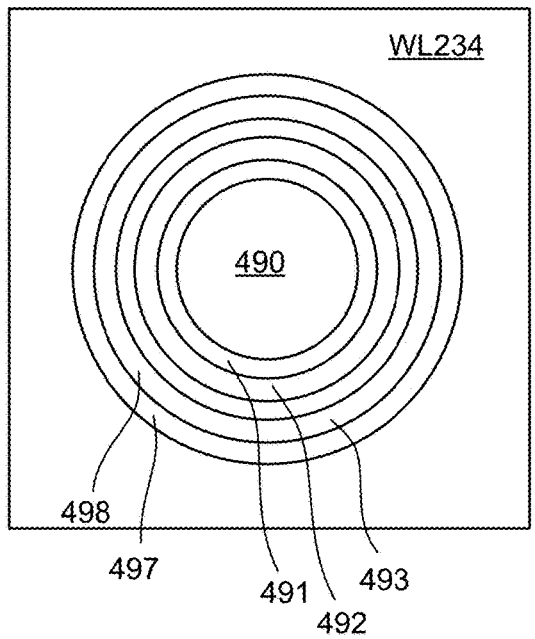
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
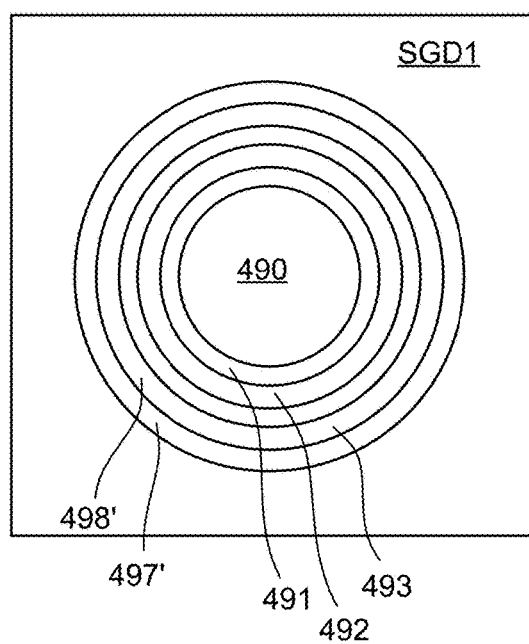
FIG. 4H depicts a cross section of as memory hole that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
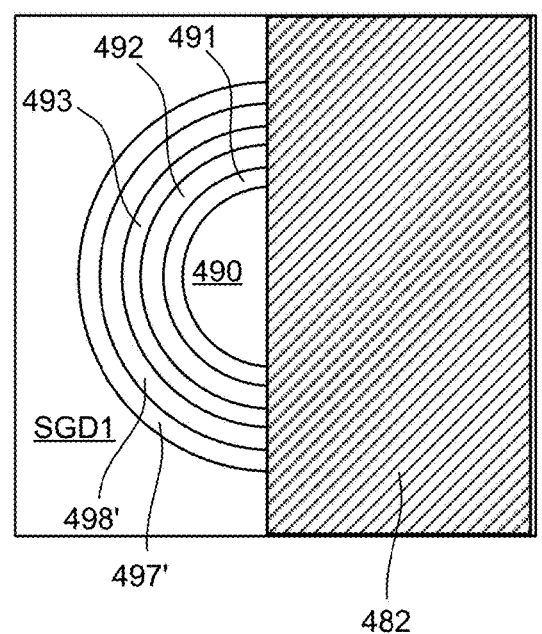
FIG. 4I depicts a cross section of as memory hole that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
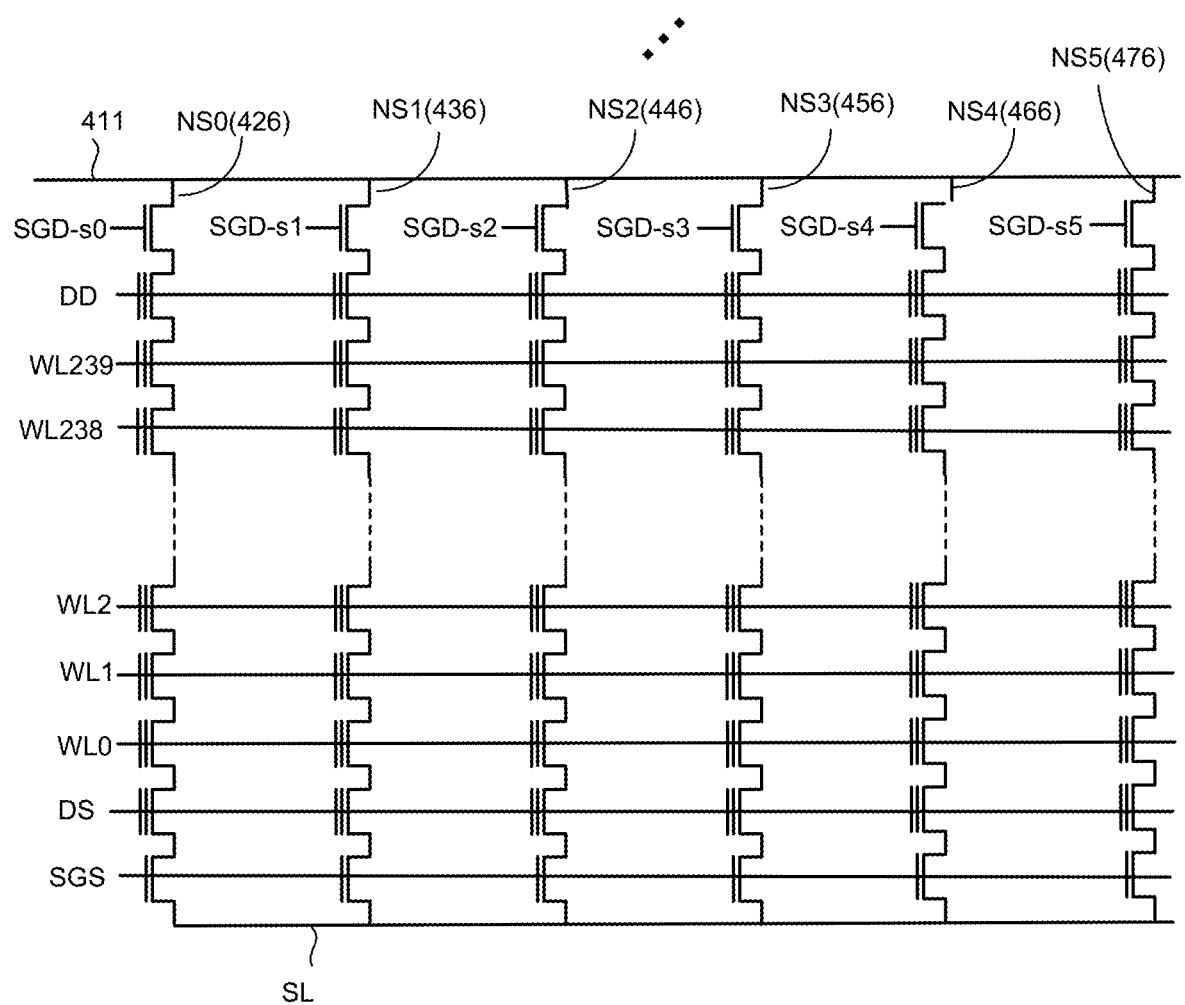
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structures that includes vertical NAND strings with charge-trapping material, other (2D and 3D) memory structures can also be used with the technology described herein.

Figure 5A:
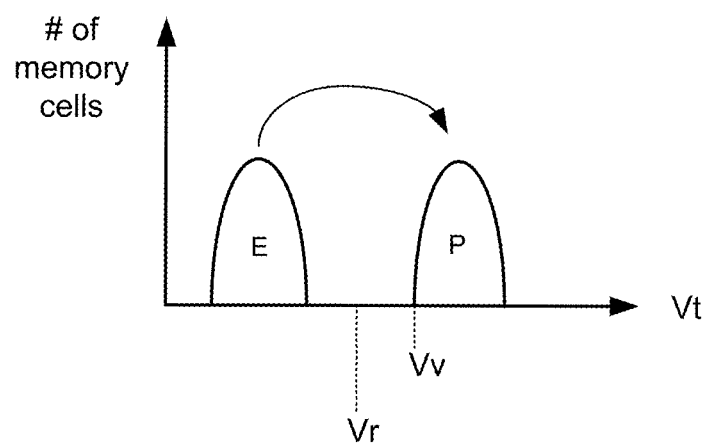
FIG. 5A depicts threshold voltage distributions.

The memory systems discussed above can be erased, programmed (with host data) and read using the control circuit described above. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
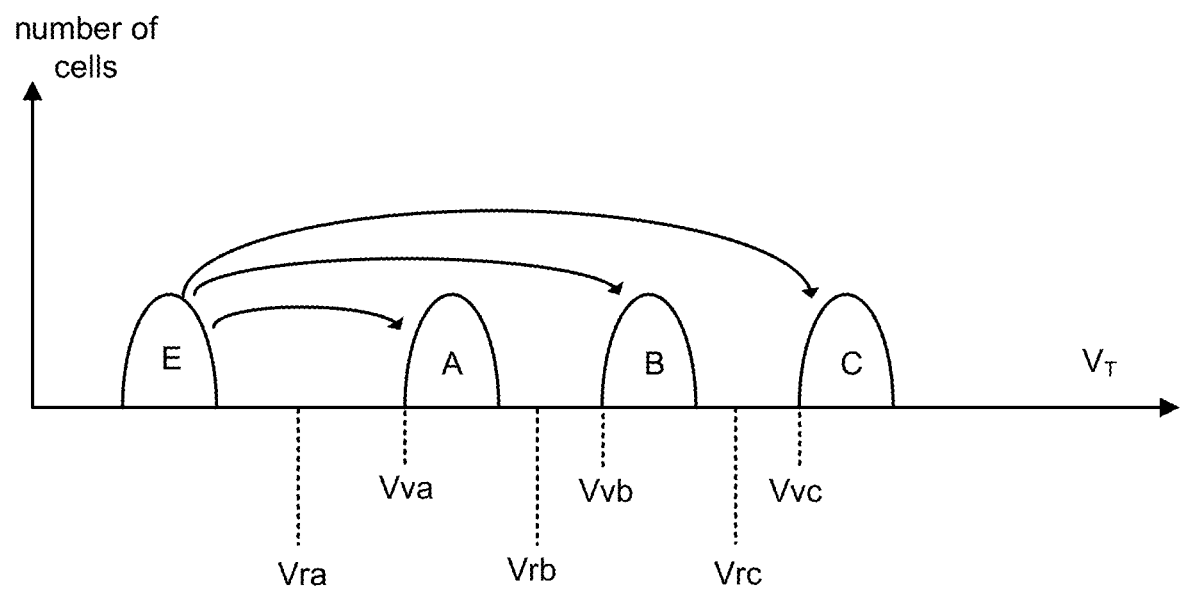
FIG. 5B depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|----|----|----|----|----|----|----|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 5C) or verify operation (e.g. see verify target levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 1  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 6:
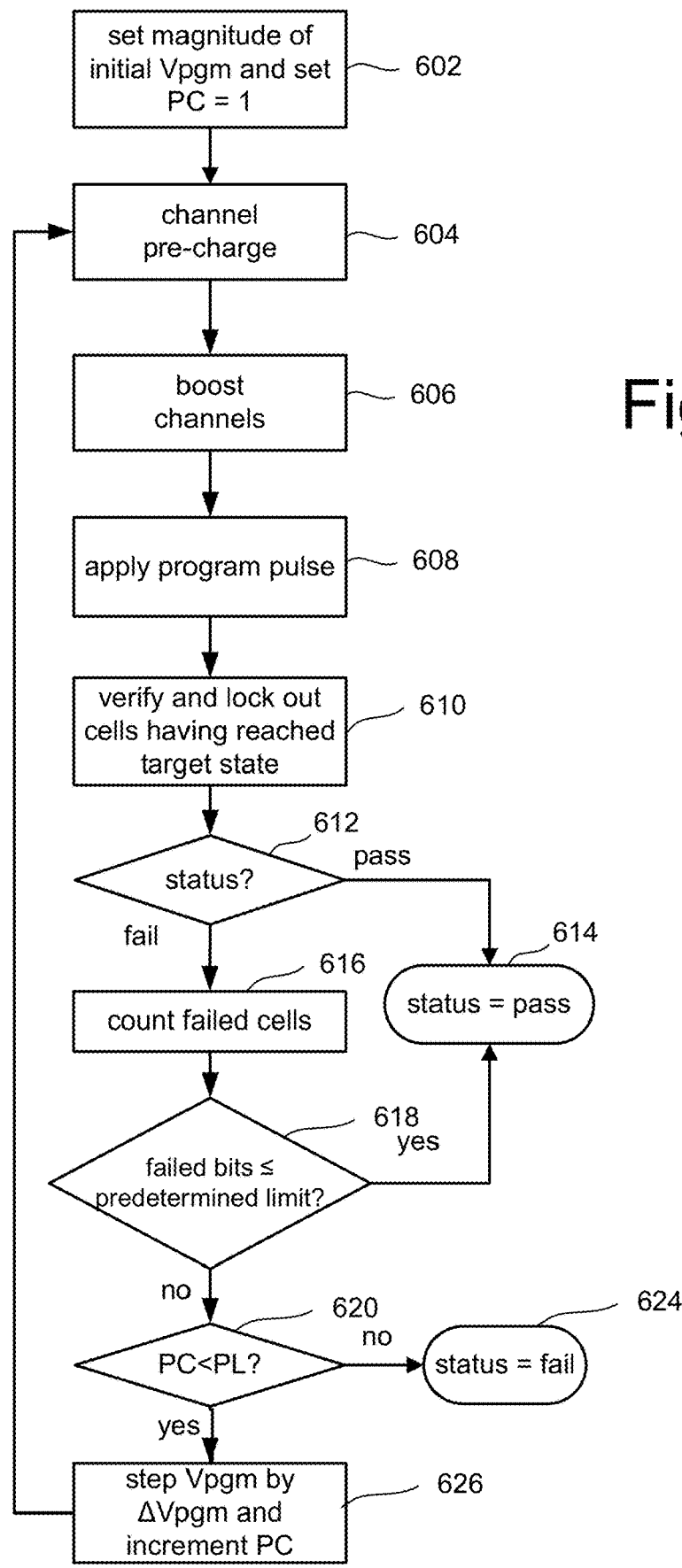
FIG. 6 is a flow chart describing one embodiment of a process for programming non-volatile memory.

FIG. 6 is a flowchart describing one embodiment of a process for programming host data (or system data) into memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 3262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

As mentioned above, in order to more reliably store data in non-volatile memory storage system, a memory health management system based on machine learning is used to predict a defect in the storage system before there is a failure that can affect the data being stored. The memory health management system comprises three components: a pre-trained model, on-the-fly diagnostics and on-the-fly reactions. The pre-trained model is based on ex-situ activity apart from memory die assembly. This purpose is to train AI/machine learning models with volume data from technology development, which works best with high computing power. After training, this pre-trained model is downloaded into non-volatile memory cells 204 (AI blocks) of memory array 202 during factory testing.

Once the pre-trained model is resident in memory array 202, on-the-fly diagnostics are performed. When memory die assembly is used in the field, memory controller 120 collects failure information including both extrinsic data (leaky, Vt distribution, RC, etc.) and intrinsic data (Vt budget, Vt width) in response to a pre-failure alarm being triggered. An AI Circuit (implementing an inference engine) will diagnose potential defects based on the failure information collected by memory controller 120 and the pre-trained machine learning model which is pre-trained and pre-loaded in non-volatile memory cells 204 (AI blocks) of memory array 202.

After the diagnostic result is determined (prediction of potential and future defect), an on-the-fly reaction is performed. For example, the memory die assembly and/or the memory controller 120 can perform a countermeasure to preserve the host data prior to a non-recoverable failure in the non-volatile storage apparatus due to the defect. Based on different severity level, the different reactions will be implemented. Additionally, after reaction is performed, in one embodiment, memory controller 120 will check if this diagnostic result and reaction can be sent to memory vendor, host and/or user of the host/memory. In one embodiment, this feedback information can also be used to further improve the accuracy of the pre-trained model.

Figure 7:
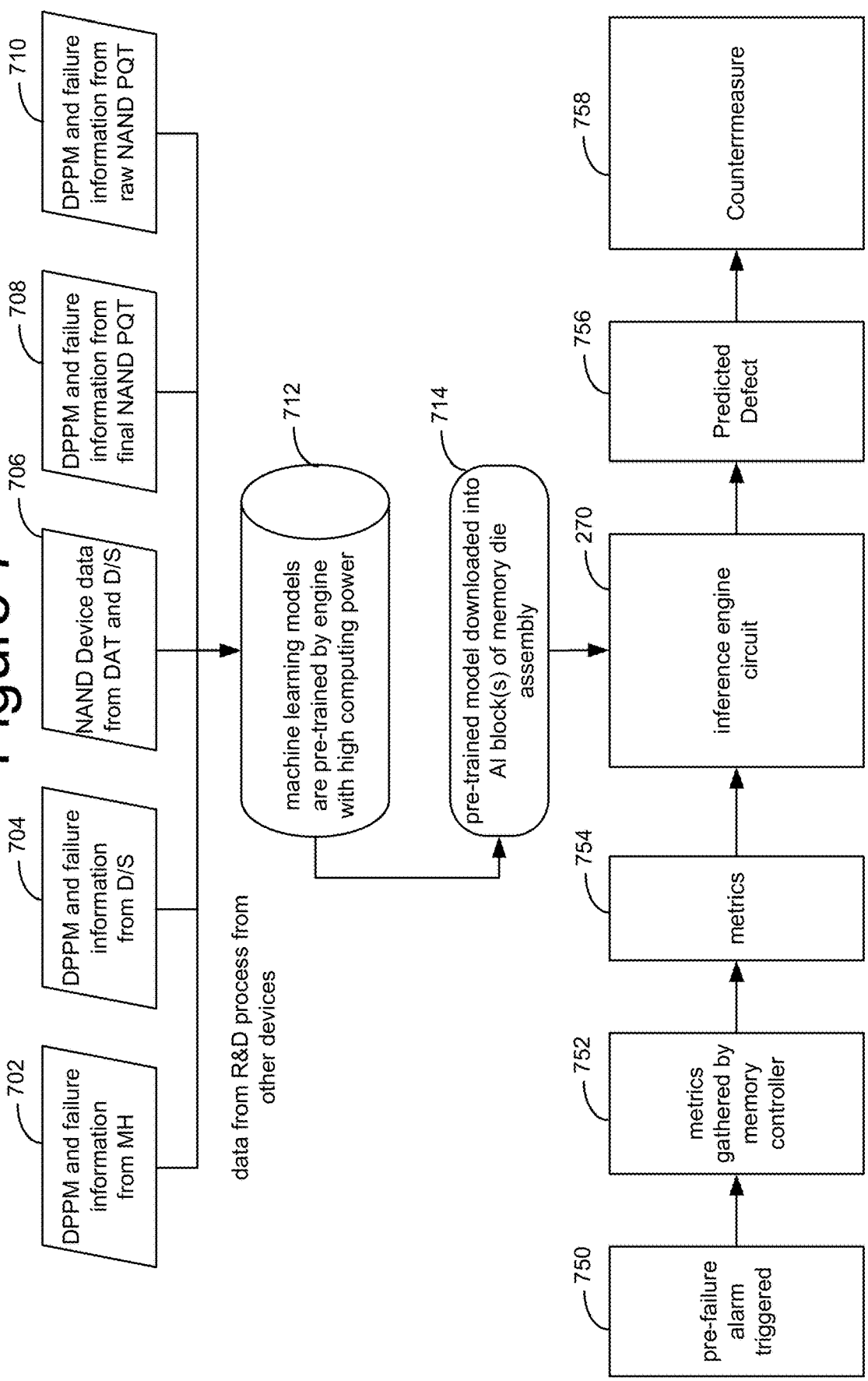
FIG. 7 is a logical block diagram that describes a non-volatile storage apparatus that includes an inference circuit positioned in a memory die assembly, such that the inference circuit is configured to use a pre-trained model with one or more metrics describing current operation of the non-volatile storage apparatus in order to predict a defect in the non-volatile storage apparatus.

FIG. 7 is a logical block diagram that describes the use of an inference circuit positioned in a memory die assembly such that the inference circuit is configured to use a pre-trained model with one or more metrics describing current operation of the non-volatile storage apparatus in order to predict a defect in the non-volatile storage apparatus. The top portion of FIG. 7 (elements 702-712) represents the ex-situ activity apart from memory die assembly to pre-train the model. Research and Development ("R&D") engineers spend a lot of resources debugging failing chips during the development of a new memory, diagnose the root causes, and then define the countermeasure. The diagnoses are based on symptoms of a failing chip. For example, sometimes a short between neighboring word lines is detected in the memory array (one example of a defect), and it is observed that threshold voltage distribution of these two word lines and adjacent word lines will have specific symptom including leaky current between word lines. The top of FIG. 7 shows five sets of data generated during the R&D process that can be used to train a model: defective parts per million ("DPPM") and failure information from memory health test platform 706, DPPM and failure information from die sort test 704, NAND device data from Device Assessment Test ("DAT") 706, DPPM and failure information from final NAND product qualification test ("PQT") 708, and DPPM and failure information from raw NAND product qualification test (PQT) 710. The data 702-710 is used to train a model (or models) using an engine with high computing power (712) and that pre-trained model(s) is downloaded (pre-loaded) into non-volatile memory cells 204 (AI blocks) of memory array 202 (714). In one embodiment, the pre-trained model is/was not trained using data about memory array 202 of storage system 100. Rather, the pre-trained model is received by storage system 100 pre-trained from a source external to storage system 100 (e.g., a R&D, testing and manufacturing environment) based on data from other storage systems/devices.

There are at least two considerations for storing pre-trained models in memory array 202. The first one is for model accuracy, as the higher volume of data inputs for model training results in the higher accuracy of the model. One key advantage is that an R&D process may have a large enough samples size when developing a new technology. Therefore, the large volume of data can result in training a very accurate AI model. A second consideration is that the AI/machine learning models needs a high performance computing engine with high computing power and it may be too expensive to include a high performance computing engine with high computing power inside the memory die assembly. Put another way, it is more cost effective to have the high computing power processor (needed for training a model) outside the memory die assembly rather than inside the memory die assembly.

Memory array 202 can afford to store the model. For example, conventional machine learning models (e.g., decision tree, random forest, XGBOOST, etc.) are typically at the KB level (e.g., using DMAT data, with ~1 GB input, ~300 parameters, the trained model is ~300 KB). Even for deep neural network model, the corresponding model size is ~100 MB level according to model depth & input size. This amount of data can fit within one block of memory array 202.

The bottom portion of FIG. 7 (elements 750-756) represents the on-the-fly diagnostics, which is based on machine learning (AI). There are different types of machine learning, such as neural networks, decision trees, support-vector machines, regression analysis, Baysian networks, genetic algorithms, random forests, etc. The technology described herein is generic to and can be implemented with the different types of machine learning and is not specific to one any type of machine learning/AI. When certain conditions occur, a pre-failure alarm is triggered to memory control 120 (750). Examples of pre-failure alarms are unusual number of program loops (e.g., steps 604-626); unusual amount of erase voltages (e.g., pulses) needed to complete erasing; large failed bit count from programming, erasing and/or reading; and unexpected change in program voltage Vpgm, erase voltage, power supply voltage, pass voltages, reference voltages, control voltages, etc. Other conditions can also trigger the pre-failure alarm. In some embodiments, the pre-failure alarm is triggered when an unusual condition exists but before there is a known defect and before there is a non-recoverable failure in the non-volatile storage apparatus due to the defect.

In response to the known defect, memory controller 120 gathers (752) one or more metrics (754) describing current operation of the storage system 100 in order to predict a future/potential defect in the storage system 100 before there is a non-recoverable failure in the storage system 100 due to the defect. Examples of metrics include data word line threshold voltage distribution, Non-data word line threshold voltage distribution, failed bit count ("FBC"); word line RC value, bit line RC value, Bitmap, miscellaneous leaky measurements (e.g., leaky analog current or leaky digital DAC between word lines, leaky analog current or leaky digital DAC between bit lines, leaky analog current or leaky digital DAC between WL and channels), bad columns count, bad block count, Iccs (standby current), values of various control signals, program disturb, read disturb, data retention issues, Natural Vth (measure Vth width after program operation without verify), program noise, read noise, program speed, erase speed, vboost, verify noise, Neighbor word line disturb, Icell, VSGD margin, Vpass margin, SENSE-Natural-Vt, DIBL, and cross temperature Vt budget. Other metrics can also be gathered.

The metrics 754 are provided to inference circuit 270, which uses the metrics (all or a subset) with the pre-trained model to predict a future/potential defect (predicted defect 756) in the storage system 100. Examples of die level defects include leaky pumps, leaky cgi, defective latches, defective sense amplifiers, nonlinear DACs, row driver open/short, and column drive open/short. Examples of block level defects include WL-WL short, WL-MH short, WL-DMH short, WL-LI short, SGD Leak, SGS Leak, SGSB Leak, BLKSEL Leak, SGD Downshift, SGD Upshift, slow to program and slow to erase. Other defects can also be predicted. The technology described herein is not limited to the metrics and defects listed above, and can be used for other metrics and/or defects.

The predicted defect(s) is used to (optionally) perform one or more countermeasures to preserve the host data prior to a non-recoverable failure in the non-volatile storage apparatus due to the defect (758). More details about the countermeasures us described below with respect to FIG. 10.

Figure 8:
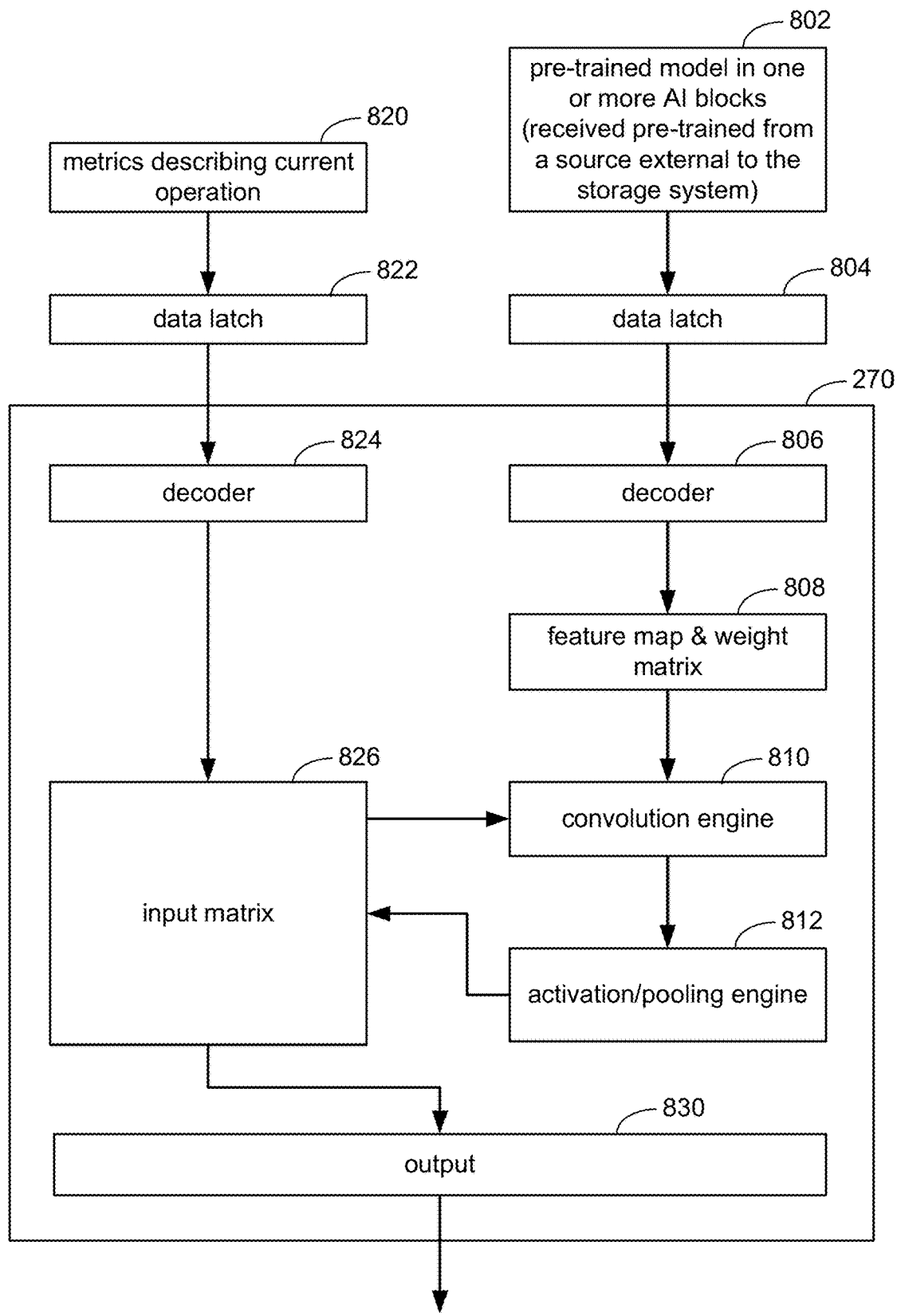
FIG. 8 is a block diagram of one embodiment of an inference engine.

FIG. 8 is a block diagram of one embodiment of an inference circuit 270. As depicted, inference circuit 270 receives two sets of inputs: pre-trained model 802 in one or more AI blocks (received pre-trained from a source external to the storage system) of memory array 202 and one or more metrics 820 describing current operation of the storage system (including memory array 202). The pre-trained model 802 is read from one or more AI blocks of memory array 202 and stored in a data latch 804, where the model is provided to a decoder 806 that puts the data representing the model in an expected format for a feature map and weight matrix 808. The features and weights are provided to a convolution engine 810 which is known in the art as an example of a convolutional neural network (however, other machine learning technologies can also be used in addition to or instead of).

The one or more metrics are provided by memory controller 120 and stored in a data latch 822, where the metrics are provided to a decoder 824 that puts the data representing the metrics in an expected format for input matrix 826. As depicted, input matrix 826 provides the one or more metrics to convolution engine 810. Based on the one or more metrics and the pre-trained model, convolution engine 810 computes one or more inferences, the output of which is provided to activation/pooling engine 812. Pooling is a form of non-linear down-sampling. There are several non-linear functions that can suitably implement pooling (e.g., max pooling). In one embodiment, an activation function effectively removes negative values by setting them to zero (or another value). Activation introduces nonlinearities to the decision function and in the overall network without affecting the receptive fields of the convolution layers. The output of activation/pooling engine 812 updates the input matrix 826. Over one or more iterations, one or more inferences are generated and outputted from input matrix 826 to an output register 830. In one embodiment, inference engine 270 (including output register 830) communicates with state machine 262 and memory controller 120 to report potential defects and take countermeasures.

Figure 9:
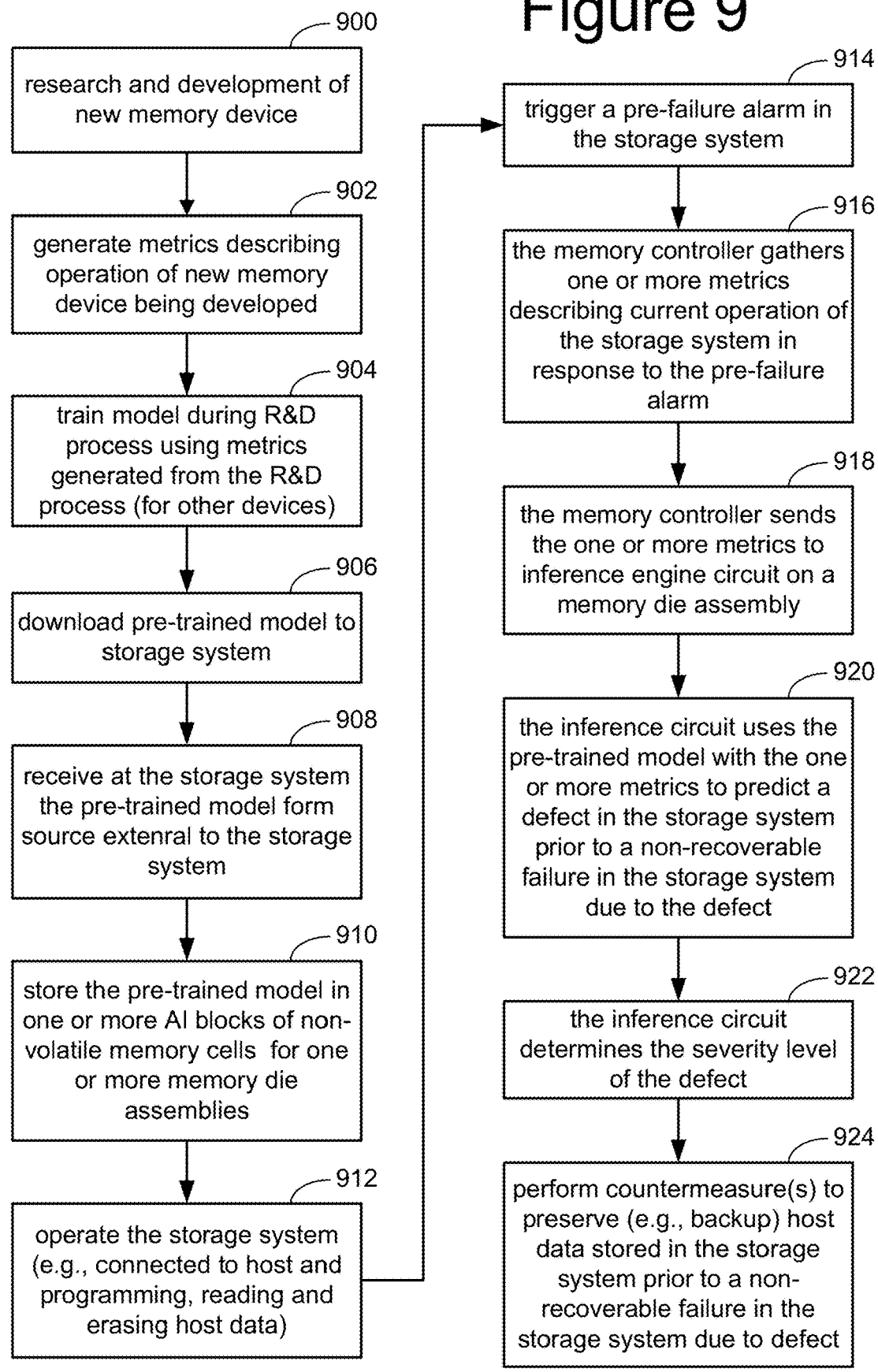
FIG. 9 is a flow chart describing one embodiment of a process for using a pre-trained model with one or more metrics describing current operation in order to predict a defect in a non-volatile storage apparatus and perform a countermeasure to preserve host data prior to a non-recoverable failure in the non-volatile storage apparatus due to the defect.

FIG. 9 is a flow chart describing one embodiment of a process for using a pre-trained model with one or more metrics describing current operation in order to predict a defect in a non-volatile storage apparatus and perform a countermeasure to preserve host data prior to a non-recoverable failure in the non-volatile storage apparatus due to the defect. In one embodiment, all or a portion of the process of FIG. 9 is performed by inference circuit 270. In one embodiment, the process of FIG. 9 is performed by any of the control circuits mentioned above, including inference circuit 270. The process of FIG. 9 can be performed using the systems of FIGS. 7 and 8.

In step 900 of FIG. 9, research and development is performed for a new memory device. In step 902, as a result of the research and development, multiple metrics are generated describing the operation of the new memory device being developed. The various metrics could include the sources of data depicted in FIG. 7, including sources 702-710. In one embodiment of steps 900 and 902, metrics are generated for hundreds, thousands, tens of thousands, or millions of devices. In step 904, the system trains a model during the research and development process using the metrics generated in step 902 (from metrics for devices other than the memory device that will eventually use the pretrained model). This includes the machine learning 712 of FIG. 7. In step 906, the pretrained model is downloaded to a new storage system (e.g., storage system 100). In one embodiment, memory controller 120 downloads the model or receives the model (step 908) at storage system 100 from a source external to the storage system (e.g., a server at an R&D facility). In step 910, memory controller 120 stores the pretrained model in one or more AI blocks (memory cells 204) of memory 202. In step 912, the storage system is operated by a host and/or user. For example, storage system is connected to or within a host 102. During operation host data will be programmed into memory array 202, read from memory array 202, and/or erased from memory array 202.

In step 914, a pre-failure alarm is triggered in storage system 100 (see block 750 of FIG. 7). In step 916, memory controller 120, which received the pre-failure alarm, gathers one or more metrics describing the current operation of the storage system 100 in response to the pre-failure alarm (see boxes 752-754 of FIG. 7). In step 918, memory controller 120 sends the one or more metrics to inference engine circuit 270 on the memory die assembly. In step 920, inference circuit 270 used the pretrained model with the one or more metrics to predict a defect in the storage system prior to a nonrecoverable failure in the storage system due to that defect (and, in some embodiments, prior to manifestation of the defect). In step 922, inference circuit 270 determines the severity level of the defect. For example, inference engine circuit 270 can be configured to classify the defects based on a level of severity from three or more levels of severity, and perform different remedial actions based on the classified level of severity. In step 924, inference circuit, state machine, memory controller, and/or another processor perform one or more countermeasures to preserve (e.g., backup) host data stored in the storage system 100 prior to a nonrecoverable failure in the storage system due to the predicted defect. More details of step 924 are provided below.

As discussed above and depicted in FIG. 2, in one embodiment storage system 100 can include one memory controller communicating with multiple memory die assemblies 180 (see FIG. 2). In such a case, each of the plurality of memory die assemblies will include a separate plurality of memory cells in the form of a separate memory array 202 and a separate inference circuit 270 positioned in the respective memory die assembly. The separate inference circuit is configured to use a pretrained machine learning model that is stored in the non-volatile memory associated inside the same memory die assembly, with one or more metrics that describe the current operation of the respective memory die assembly or the storage system in order to predict a defect for the respective memory die assembly or storage system prior to a non-recoverable failure due to the defect. Each of the memory die assemblies, thus, has its own inference circuit, may make its own inferences and predict its own set of defects, all concurrently. This applies to memory die assemblies utilizing the single memory die of FIG. 2A or the integrated memory assembly of FIG. 2B.

In one embodiment, memory controller 120 is configured to communicate with a host external to the storage system 100. Each memory die assembly of the plurality of memory die assemblies includes a separate plurality of nonvolatile memory cells comprising a first set of nonvolatile memory cells configured to store host data and a second set of nonvolatile memory cells storing the pre-trained machine learning model received pretrained from a source external to the nonvolatile storage apparatus. The memory controller and the memory die assemblies are configured to backup host that will be affected by the defect and report the defect to the host in response to predicting the defect. Thus, the memory controller can send a first set of metrics to a first inference engine on a first memory die assembly and send a second set of metrics to a second inference engine on a second memory die assembly. Each of the multiple inference engines will make their own predictions for their respective memory die assemblies. Both the first inference engine and the second inference engine will use their own separate copies of the pretrained model (or different models) with the metrics provided respectively to predict their own defects prior to a non-recoverable failure in the storage system due to these defects.

Figure 10:
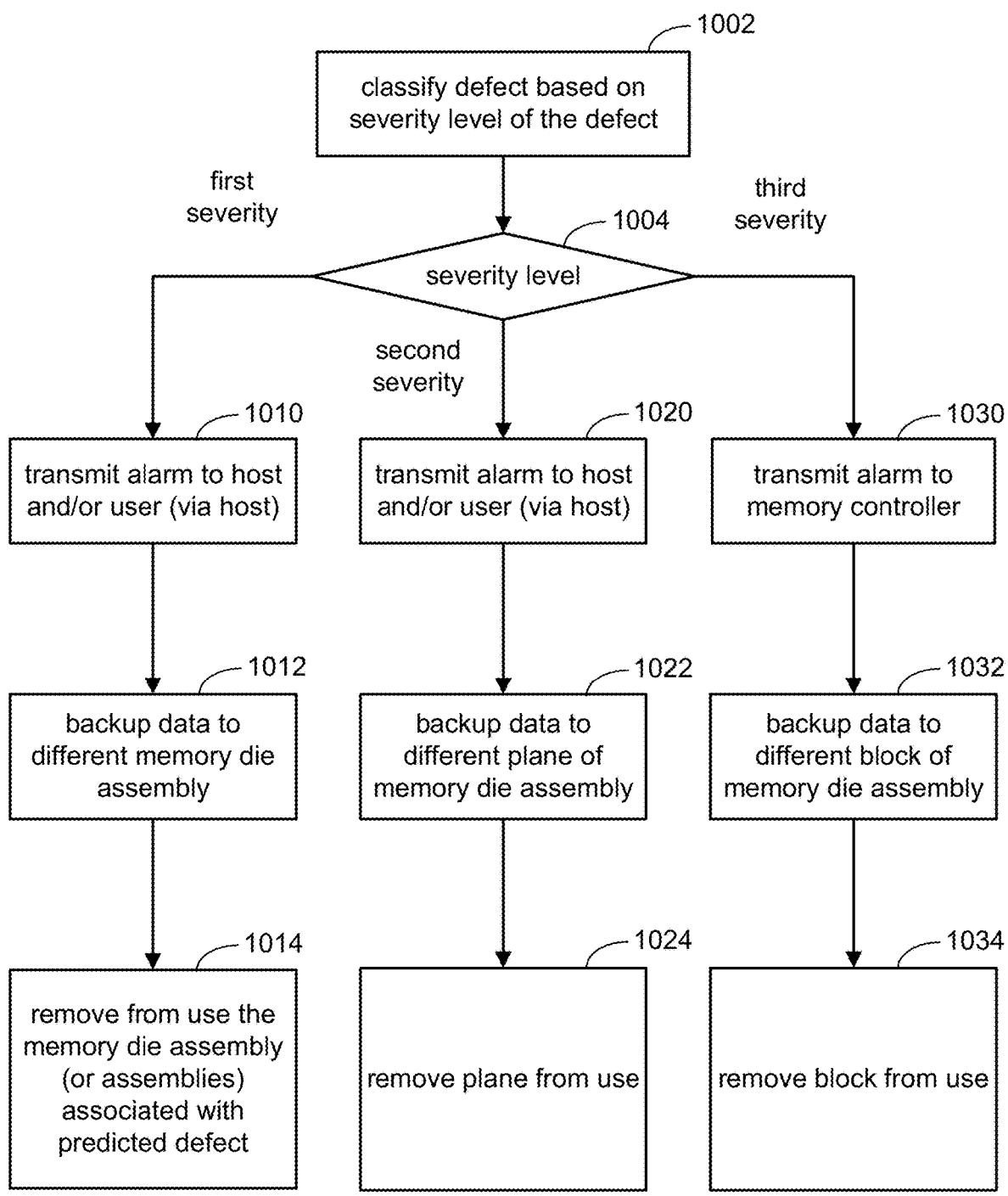
FIG. 10 is a flow chart describing one embodiment of a process for performing a countermeasure to preserve host data prior to a non-recoverable failure in the non-volatile storage apparatus due to a defect.

FIG. 10 is a flowchart describing one embodiment of a process for performing countermeasure to preserve host data prior to a non-recoverable failure in a nonvolatile storage apparatus due to the defect. Thus, the process of FIG. 10 is an example implementation of step 924 of FIG. 9 and is performed based on block 758 of FIG. 7. That is, using the process of FIG. 10, the inference circuits are configured to classify the defects based on level security from three more levels of security and perform different remedial actions based on the classified level of severity. In step 1002 of FIG. 10, the predicted defect is classified based on severity level of the defect. In one embodiment the three levels of severity can include a first severity, a second severity and a third severity. In one example implementation, the first severity is a top severity (e.g., highest priority). The second severity is a middle priority and the third severity is the lowest priority or lowest of importance. In other embodiments the seventies are based on type of defect and are not based on priority. In one example, if the severity level (step 1004) is judged to be a first severity then in step 1010 storage system 100 transmits an alarm to the host and/or the user (via the host). In step 1012, all of the data from the memory assembly that predicted the defect will be backed up (e.g., moved) to a different memory die assembly. In this level of severity, the defect or defects predicted by the inference circuit are at the system level. In step 1014, storage system 104 (e.g., memory controller 120) will remove from use the memory die assembly that is predicted to have the defect.

If the severity level (step 1004) is judged to be a second severity, then in step 1020 the storage system 100 transmits an alarm to the host and/or the user (via the host). In step 1022 data from a bad plane is backed up (moved) to a different plane on the same memory die assembly. In one example, the second severity refers to a defect at the plane level. Therefore, data from the bad plane is moved to a new good plane. In step 1024, the plane associated with the potential defect is removed from use by storage system 100.

If the severity level (step 1004) is determined to be a third level of severity, then in step 1030 the memory die assembly transmits an alarm to memory controller 120. In one embodiment, the third severity is associated with a defect in a block of the memory die assembly. In step 1032, the memory assembly will back up (move) the data from the block with the potential defect to a different block of the same memory die assembly. In step 1034, the block associated with the potential defect will be removed from further use by storage system 100. Thus, the memory controller and/or the memory die assemblies are configured to back up hosting that would be affected by the defect and report the defect to the host (and/or the user) in response to the predicting defect.

FIGS. 11-13 are flowcharts describing various embodiments of processes performed during research and development of memory devices that generates data which can be used to train the model described above. FIGS. 11-13 are analogous to blocks 702-710 of FIG. 7. In step 1102 of FIG. 11, wafer die sort is performed. In step 1104, wafer level burn in is performed. The wafer level burn in test is performed at a warm temperature and includes performing many program/erase cycles to burn in the memory. Meanwhile, test stress and screening for extrinsic defects can be employed in this step for hot temperature coverage. In step 1106, a known good die test is performed. The known good die test is performed at lower temperatures in order to test stress and screen extrinsic defects. In step 1108, a memory test is performed. The memory test is performed after the di or packaged in hot temperatures for purposes of making sure that the memory meets intended performance. In step 1110, a memory health cycle test is performed with an MRQ test (memory reliability and quality). Memory health cycle includes an array/program/recycle which mimics customer usage. The MRQ cycle is an array/program/recycle which mimics customer usage; however' it is done at the package level rather than the wafer level of the memory health cycle. If it is determined that the DPPM target has been achieved (step 1112), then the memory device development process of FIG. 11 is complete; otherwise, the process loops back to step 1102 to perform another iteration.

The process of FIG. 12 includes building a new NAND device (step 1202). In step 1204, a PreAT (Pre Acceptance Test) is performed. The pre-AT pre-exceptions test tests for re-disturbed, program disturbed and data retention and sets appropriate parameters. If the system does not pass, a new NAND device is built and tested in step 1204. If the device passes (step 1206), then a full DAT device acceptance test is performed in step 1208. The full DAT device acceptance test is similar to the pre-AT acceptance test; however, memory cell measurements are more holistic. If qualification (step 1210) does not pass, then the process loops back to step 1202 to build a new NAND device and perform the process of FIG. 12 on the new NAND device. If qualification does pass (step 1210), then the process of FIG. 12 is completed in step 1212.

In step 1302 of FIG. 13, an engineering verification test (EVT) is performed. The engineering verification test is a final level testing not only in the memory, but also the final product as a whole system. In step 1304, design verify test (DVT) is performed. The design verification test verifies product specifications. In step 1306, a reliability demonstration test (RDT) is performed. The reliability demonstration test is used to demonstrate photo product reliability, acceleration factor form elevated temperature to demonstrate large MTV values testing at high and nominal temperature. In step 1308, a process validation test (PVT) is performed. The process validation test tests manufacturing readiness of the memory die. In step 1310, an ongoing reliability test (ORT) is performed. The ongoing reliability test is a regular monitoring of the reliability of the memory di to program, retain and read memory.

A non-volatile storage apparatus has been described that comprises a memory controller connected to one or more memory die assemblies, each of which includes an inference circuit positioned in the memory die assembly. The inference circuit is configured to use a pre-trained model (received pre-trained from a source external to the non-volatile storage apparatus and stored in a dedicated block in non-volatile memory) with one or more metrics describing current operation of the non-volatile storage apparatus in order to predict a defect in the non-volatile storage apparatus and perform a countermeasure to preserve host data prior to a non-recoverable failure in the non-volatile storage apparatus due to the defect.

One embodiment includes a non-volatile storage apparatus comprising a memory die assembly. The memory die assembly comprises a non-volatile memory structure comprising a first set of non-volatile memory cells configured to store host data and a second set of non-volatile memory cells storing a pre-trained model received pre-trained from a source external to the non-volatile storage apparatus. The memory die assembly further comprises a control circuit connected to the non-volatile memory structure and configured to write to and read from the non-volatile memory structure. The control circuit comprises an inference circuit positioned in the memory die assembly. The inference circuit is configured to use the pre-trained model from the second set of non-volatile memory cells with one or more metrics describing current operation of the non-volatile storage apparatus in order to predict a defect in the non-volatile storage apparatus and perform a countermeasure to preserve the host data prior to a non-recoverable failure in the non-volatile storage apparatus due to the defect.

One embodiment includes a non-volatile storage apparatus comprising a memory controller and a plurality of memory die assemblies connected to the memory controller. Each memory die assembly of the plurality of memory die assemblies includes a separate plurality of non-volatile memory cells and a separate inference circuit positioned in the respective memory die assembly. The separate inference circuit is configured to use a pre-trained machine learning model with one or more metrics describing current operation of the respective memory die assembly in order to predict a defect in the respective memory die assembly prior to a non-recoverable failure in the respective memory die assembly due to the defect.

One embodiment includes a method, comprising: receiving at a storage system a pre-trained model from a source external to the storage system, the storage system comprises a memory controller connected to multiple memory die assemblies; storing the pre-trained model in one or more blocks of non-volatile memory cells in the storage system; triggering a pre-failure alarm in the storage system; the memory controller gathering one or more metrics describing current operation of the storage system in response to the pre-failure alarm; the memory controller sending the one or more metrics to a first inference engine circuit on a first memory die assembly of the multiple memory die assemblies; and the first inference engine using the pre-trained model with the one or more metrics to predict a defect in the storage system prior to a non-recoverable failure in the storage system due to the defect.

One example implementation further comprises the memory controller sending the additional metrics to a second inference engine circuit on a second memory die assembly of the multiple memory die assemblies; and the second inference engine using the pre-trained model with the additional metrics to predict a second defect in the storage system prior to a non-recoverable failure in the storage system due to the second defect.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a memory die assembly comprising:
      a non-volatile memory structure comprising a first set of non-volatile memory cells configured to store host data and a second set of non-volatile memory cells storing a pre-trained model received from a source external to the non-volatile storage apparatus; and
      a control circuit connected to the non-volatile memory structure and configured to write to and read from the non-volatile memory structure, the control circuit comprises an inference circuit positioned in the memory die assembly, the inference circuit is configured to use the pre-trained model from the second set of non-volatile memory cells with one or more metrics describing current operation of the non-volatile storage apparatus in order to predict a defect in the non-volatile storage apparatus and perform a countermeasure to preserve the host data prior to a non-recoverable failure in the non-volatile storage apparatus due to the defect.

2. The non-volatile storage apparatus of claim 1, wherein:
   the memory die assembly comprises a memory die; and
   the non-volatile memory structure and the inference circuit are both positioned on the memory die.

3. The non-volatile storage apparatus of claim 1, wherein:
   the memory die assembly comprises a memory die bonded to control die;
   the non-volatile memory is positioned on the memory die; and
   the inference circuit is positioned on the control die.

4. The non-volatile storage apparatus of claim 1, further comprising:
   a memory controller connected to the memory die assembly, the memory controller is configured to gather the one or more metrics describing current operation of the non-volatile storage apparatus and transmit the one or more metrics to the memory die assembly in response to a pre-failure alarm.

5. The non-volatile storage apparatus of claim 1, wherein:
   the second set of non-volatile memory cells include an erase block dedicated to storing the pre-trained model.

6. A non-volatile storage apparatus, comprising:
   a memory controller; and
   a plurality of memory die assemblies connected to the memory controller, each memory die assembly of the plurality of memory die assemblies includes:
      a separate plurality of non-volatile memory cells, and
      a separate inference circuit positioned in the respective memory die assembly, the separate inference circuit is configured to use a pre-trained machine learning model with one or more metrics describing current operation of the respective memory die assembly in order to predict a defect in the respective memory die assembly prior to a non-recoverable failure in the respective memory die assembly due to the defect, the non-volatile storage apparatus is configured to perform a countermeasure prior to a non-recoverable failure in the respective memory die assembly due to the defect.

7. The non-volatile storage apparatus of claim 6, wherein:
   each memory die assembly of the plurality of memory die assemblies comprises a separate memory die such that the respective separate plurality of non-volatile memory cells and the respective separate inference circuit are positioned on the separate memory die.

8. The non-volatile storage apparatus of claim 6, wherein:
   each memory die assembly of the plurality of memory die assemblies comprises a separate memory die bonded to separate control die bonded such that the respective separate plurality of non-volatile memory cells and the respective separate inference circuit are positioned on the separate control die.

9. The non-volatile storage apparatus of claim 6, wherein:
   for each memory die assembly of the plurality of memory die assemblies, the separate plurality of non-volatile memory cells includes a first set of non-volatile memory cells configured to store host data and a second set of non-volatile memory cells storing the pre-trained machine learning model received from a source external to the non-volatile storage apparatus.

10. The non-volatile storage apparatus of claim 6, wherein:
    for each memory die assembly of the plurality of memory die assemblies, the separate plurality of non-volatile memory cells store host data; and
    the memory controller and the memory die assemblies are configured to perform a countermeasure to preserve the host data prior to the non-recoverable failure in the non-volatile memory structure due to the defect.

11. The non-volatile storage apparatus of claim 6, wherein:
    the memory controller is configured to gather the one or more metrics describing current operation of the respective memory die assembly and transmit the one or more metrics to the respective memory die assembly.

12. The non-volatile storage apparatus of claim 6, wherein:
    the memory controller is configured to gather the one or more metrics describing current operation of the respective memory die assembly and transmit the one or more metrics to the respective memory die assembly in response to a pre-failure alarm.

13. The non-volatile storage apparatus of claim 6, wherein:
    the inference circuit are configured to classify the defect based on level of severity from three or more levels of severity and perform different remedial actions based on the classified level of severity.

14. The non-volatile storage apparatus of claim 6, wherein:
the memory controller is configured to communicate with a host external to the non-volatile storage apparatus;
for each memory die assembly of the plurality of memory die assemblies, the separate plurality of non-volatile memory cells includes a first set of non-volatile memory cells configured to store host data and a second set of non-volatile memory cells storing the pre-trained machine learning model received from a source external to the non-volatile storage apparatus; and
the memory controller and the memory die assemblies are configured to back up host data that would be affected by the defect and report the defect to the host in response to predicting the defect.

15. A method, comprising:
receiving at a storage system a pre-trained model from a source external to the storage system, the storage system comprises a memory controller connected to multiple memory die assemblies;
storing the pre-trained model in one or more blocks of non-volatile memory cells in the storage system;
triggering a pre-failure alarm in the storage system;
the memory controller gathering one or more metrics describing current operation of the storage system in response to the pre-failure alarm;
the memory controller sending the one or more metrics to a first inference engine circuit on a first memory die assembly of the multiple memory die assemblies;
the first inference engine using the pre-trained model with the one or more metrics to predict a defect in the storage system prior to a non-recoverable failure in the storage system due to the defect; and
performing a countermeasure to preserve host data stored in the storage system prior to a non-recoverable failure in the storage system due to the defect.

16. The method of claim 15, further comprising:
training the model using data from devices other than the storage system.

17. The method of claim 15, further comprising:
training the model during a research and development process using data from the research and development process.

18. The method of claim 15, further comprising:
the memory controller sending the additional metrics to a second inference engine circuit on a second memory die assembly of the multiple memory die assemblies; and
the second inference engine using the pre-trained model with the additional metrics to predict a second defect in the storage system prior to a non-recoverable failure in the storage system due to the second defect.

* * * * *